US012695047B1

(12) United States Patent
Lee et al.

(10) Patent No.: US 12,695,047 B1
(45) Date of Patent: Jul. 28, 2026

(54) DEVICES AND METHODS FOR ELECTROSTATIC ION BEAM DEFLECTION AND FILTRATION

(71) Applicant: Clocktower Engineering Inc., Beverly, MA (US)

(72) Inventors: William Davis Lee, Rockport, ME (US); Mark R. Amato, Swampscott, MA (US); Robert Amato, Bedford, MA (US)

(73) Assignee: Clocktower Engineering Inc., Beverly, MA (US)

( * ) Notice: Subject to any disclaimer, the term of this patent is extended or adjusted under 35 U.S.C. 154(b) by 0 days.

(21) Appl. No.: 19/435,497

(22) Filed: Dec. 29, 2025

Related U.S. Application Data

(60) Provisional application No. 63/893,507, filed on Oct. 3, 2025.

(51) Int. Cl.
*H01J 37/147* (2006.01)
*H01J 37/317* (2006.01)

(52) U.S. Cl.
CPC ...... *H01J 37/1477* (2013.01); *H01J 37/3171* (2013.01); *H01J 2237/057* (2013.01)

(58) Field of Classification Search
CPC ........ H01J 37/00; H01J 37/02; H01J 37/1477; H01J 37/3171; H01J 2237/057

USPC ...................................................... 250/396 R
See application file for complete search history.

(56) References Cited

U.S. PATENT DOCUMENTS

| | | | |
|---|---|---|---|
| 7,888,653 B2 | 2/2011 | Kellerman et al. | |
| 2019/0198283 A1* | 6/2019 | Radovanov | ............. H01J 37/05 |
| 2020/0161089 A1* | 5/2020 | Likhanskii | ............. H01J 37/08 |

* cited by examiner

*Primary Examiner* — Jason L Mccormack
(74) *Attorney, Agent, or Firm* — Morrison & Foerster LLP

(57) ABSTRACT

A device for electrostatic deflection of an ion beam is provided. The device comprises an entrance aperture, an exit aperture, and a first electrode set disposed above an ion beam path with a first entrance-end electrode positioned closest to the entrance aperture and a first exit-end electrode positioned closest to the exit aperture. The device further comprises a second electrode set disposed below the ion beam path with a second entrance-end electrode positioned closest to the entrance aperture and a second exit-end electrode positioned closest to the exit aperture. The first entrance-end electrode is biased to within 5% of an electric potential to which the first exit-end electrode is biased, the second entrance-end electrode is biased to within 5% of an electric potential to which the second exit-end electrode is biased, and the first electrode set comprises a different number of electrodes than the second electrode set.

27 Claims, 10 Drawing Sheets
(2 of 10 Drawing Sheet(s) Filed in Color)

100

100

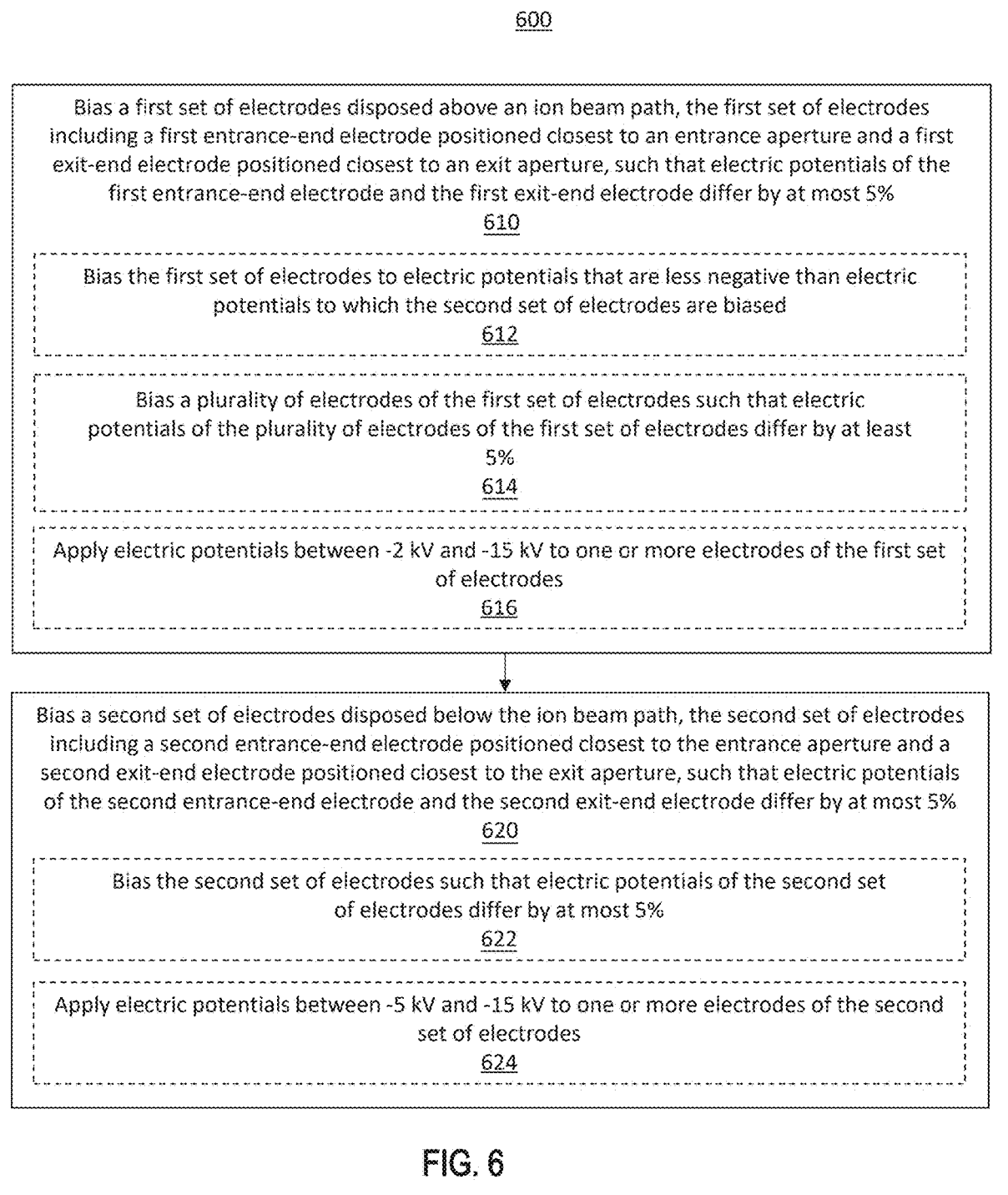

600

Bias a first set of electrodes disposed above an ion beam path, the first set of electrodes including a first entrance-end electrode positioned closest to an entrance aperture and a first exit-end electrode positioned closest to an exit aperture, such that electric potentials of the first entrance-end electrode and the first exit-end electrode differ by at most 5%
610

Bias the first set of electrodes to electric potentials that are less negative than electric potentials to which the second set of electrodes are biased
612

Bias a plurality of electrodes of the first set of electrodes such that electric potentials of the plurality of electrodes of the first set of electrodes differ by at least 5%
614

Apply electric potentials between -2 kV and -15 kV to one or more electrodes of the first set of electrodes
616

Bias a second set of electrodes disposed below the ion beam path, the second set of electrodes including a second entrance-end electrode positioned closest to the entrance aperture and a second exit-end electrode positioned closest to the exit aperture, such that electric potentials of the second entrance-end electrode and the second exit-end electrode differ by at most 5%
620

Bias the second set of electrodes such that electric potentials of the second set of electrodes differ by at most 5%
622

Apply electric potentials between -5 kV and -15 kV to one or more electrodes of the second set of electrodes
624

FIG. 6

DEVICES AND METHODS FOR ELECTROSTATIC ION BEAM DEFLECTION AND FILTRATION

CROSS-REFERENCE TO RELATED APPLICATIONS

This application claims the benefit of U.S. Provisional Application No. 63/893,507, filed Oct. 3, 2025, the entire contents of which are incorporated herein by reference.

FIELD

The present disclosure relates generally to ion processing systems such as ion implanters and specifically to devices for electrostatic ion beam deflection and filtration.

BACKGROUND

Ion processing systems including ion implanters and related charged particle-based instruments, may be used to modify the electrical properties of semiconductor materials during the fabrication of memory devices, processor chips, and other integrated circuits. Such systems may direct ions from a source through a sequence of electrostatic and magnetostatic elements configured to deflect, focus, filter, accelerate, decelerate, or otherwise condition the ion beam. Said conditioning may ensure that the ion beam has the requisite energy, angular distribution, and/or dose uniformity before impinging on a workpiece such as a silicon substrate. Electrostatic devices in such systems configured to deflect the ion beam may include symmetric arrangements of electrodes positioned above and below the ion beam path. Such symmetric arrangements may impose practical limitations on the maximum deflection angle and limit flexibility in generating nonuniform electric potential distributions. These electrostatic devices may also couple deflection with a net acceleration or deceleration that changes ion beam energy at device exit, thereby constraining allowable input and/or output energies.

SUMMARY

Disclosed herein are electrostatic devices and methods for deflecting ion beams (e.g., wide ribbon ion beams) according to their energy. By deflecting ions based on their energy, the disclosed devices may operate as energy filters, removing ions of unintended charge state or energy before they reach the workpiece. In some implementations, the disclosed devices may be in the shape of a filet and may include upper and lower sets of electrodes with different numbers of electrodes.

Such asymmetric arrangements may support a wider range of deflection angles than symmetric configurations while providing control over ion trajectories.

In some implementations, electrodes of the disclosed devices may be biased to create electric fields that deflect the ion beam at a predetermined vertical angle without producing a substantial net acceleration or deceleration. For example, by not substantially accelerating or decelerating the ion beam, exemplary electrostatic deflection devices may maintain net beam energy from device entrance to exit. Biasing electrodes in the aforementioned manner may generate electric fields that additionally enable steering, parallelization, focusing, and/or controlled divergence (e.g., defocusing) of the ion beam, thereby improving control of the beam impinging on the workpiece. By deflecting without modifying net energy, the disclosed devices and methods may ease integration with upstream and downstream beamline components and may support low-energy and/or molecular ion delivery for a variety of semiconductor processing applications.

Electrostatic deflection devices disclosed herein may include an entrance aperture and an exit aperture defining endpoints of an ion beam path, an upper set of electrodes above the beam path, and a lower set of electrodes below the beam path. The number of electrodes in the upper set of electrodes may exceed the number of electrodes in the lower set of electrodes, producing an asymmetric electrode distribution. In some implementations, at least a subset of the upper electrodes may be biased to mutually different electric potentials while lower electrodes may be biased to substantially similar electric potentials. Such electric potential configurations may create electric field gradients that control ion beam deflection while minimizing changes to net beam energy. Because an ion's deflection varies inversely with its incident energy, the disclosed devices may also be configured such that ions outside of a desired energy or charge-state window follow paths that do not pass through the exit aperture, thereby improving the energy purity of the beam reaching the workpiece.

Electrodes may take the form of rods, plates, and/or wire-based structures, and may include machined insulating supports and/or piston-type vacuum seals. In some implementations, electrodes may be constructed as multi-component assemblies, such as rods formed by joining a graphite center portion with metal edge portions. Electrode geometries, spacings, and/or electric potential distributions may be configured such that ion beams having energies up to approximately 5-15 keV are deflected to angles greater than 30 degrees.

Open electrode configurations, such as those formed using rod or wire-based electrodes, may provide a less obstructed path for gas removal when reducing the environment of disclosed electrostatic devices to vacuum. Such configurations may also reduce interactions that could neutralize or alter the charge state of the ion beam, and present fewer surfaces on which material evolving off the workpiece (e.g., photoresist) may accumulate, thereby reducing the device's contribution to particle contamination of the workpiece. Electrodes may be biased to a negative potential with respect to ground, thereby suppressing electron generation and reducing associated X-ray emissions.

In some embodiments, a device for electrostatic deflection of an ion beam is provided, wherein the device comprises: an entrance aperture to allow the ion beam to enter the device; an exit aperture to allow the ion beam to exit the device; a first set of electrodes disposed above an ion beam path, wherein the first set of electrodes comprises: a first entrance-end electrode positioned closest, of the first set of electrodes, to the entrance aperture; and a first exit-end electrode positioned closest, of the first set of electrodes, to the exit aperture, wherein the first entrance-end electrode is biased to within 5% of an electric potential to which the first exit-end electrode is biased; and a second set of electrodes disposed below the ion beam path, wherein the second set of electrodes comprises: a second entrance-end electrode positioned closest, of the second set of electrodes, to the entrance aperture; and a second exit-end electrode positioned closest, of the second set of electrodes, to the exit aperture, wherein the second entrance-end electrode is biased to within 5% of an electric potential to which the second exit-end electrode is biased, and wherein the first set of electrodes comprises a different number of electrodes than the second set of electrodes.

In some embodiments, the first set of electrodes are biased to electric potentials that are less negative than electric potentials to which the second set of electrodes are biased. In some embodiments: a plurality of electrodes of the first set of electrodes are biased such that electric potentials of the plurality of electrodes of the first set of electrodes differ by at least 5%, and the second set of electrodes are biased such that electric potentials of the second set of electrodes differ by at most 5%. In some embodiments, one or more electrodes of the first set of electrodes and the second set of electrodes are biased to electric potentials between −2 kV and −15 kV. In some embodiments, one or more electrodes of the first set of electrodes are biased to electric potentials between −2 kV and −15 kV. In some embodiments, one or more electrodes of the second set of electrodes are biased to electric potentials between −5 kV and −15 kV. In some embodiments, the first entrance-end electrode is electrically coupled to the first exit-end electrode, and the second entrance-end electrode is electrically coupled to the second exit-end electrode. In some embodiments, the electric potential distribution across the first set of electrodes, from the first entrance-end electrode to the first exit-end electrode, is symmetric. In some embodiments, the electric potential distribution across the second set of electrodes, from the second entrance-end electrode to the second exit-end electrode, is symmetric.

In some embodiments, the first set of electrodes comprises a greater number of electrodes than the second set of electrodes. In some embodiments, the first set of electrodes comprises 3-7 electrodes and the second set of electrodes comprises 1-5 electrodes. In some embodiments, the first set of electrodes comprises 5 electrodes and the second set of electrodes comprises 3 electrodes. In some embodiments, the ion beam has a maximum energy of 5 keV. In some embodiments, a central ray trajectory of the ion beam is deflected at a vertical angle of between 30 degrees and 90 degrees. In some embodiments, a central ray trajectory of the ion beam is deflected at a vertical angle of 35 degrees. In some embodiments, biasing the first set of electrodes and the second set of electrodes produces at least one effect on the ion beam selected from a group consisting of: parallelizing the ion beam, focusing the ion beam, and increasing a divergence of the ion beam.

In some embodiments, the device further comprises an insulator configured to electrically isolate an electrode of the first set of electrodes and an electrode of the second set of electrodes. In some embodiments, one or more electrodes of the first set of electrodes, one or more electrodes of the second set of electrodes, or both, each comprise a circular cross section, wherein a diameter of the circular cross section is between 8 mm and 24 mm. In some embodiments, the device further comprises one or more piston vacuum seals configured to hermetically seal one or more electrodes of the first set of electrodes, one or more electrodes of the second set of electrodes, or both. In some embodiments, one or more electrodes of the first set of electrodes, one or more electrodes of the second set of electrodes, or both, comprise graphite and aluminum. In some embodiments, one or more electrodes of the first set of electrodes, one or more electrodes of the second set of electrodes, or both, comprise a cylindrical graphite component, wherein the cylindrical graphite component is mated at a first end to a first cylindrical aluminum component and the cylindrical graphite component is mated at a second end to a second cylindrical aluminum component.

In some embodiments, one or more electrodes of the first set of electrodes or the second set of electrodes each comprise one or more wires disposed circumferentially about a central axis of a respective electrode of the one or more electrodes of the first set of electrodes or the second set of electrodes. In some embodiments, the one or more wires comprise 4-12 wires. In some embodiments, one or more electrodes of the first set of electrodes each comprise one or more wires disposed circumferentially about a central axis of a respective electrode of the one or more electrodes of the first set of electrodes. In some embodiments, the one or more wires comprise 4-12 wires. In some embodiments, one or more electrodes of the second set of electrodes each comprise one or more wires disposed circumferentially about a central axis of a respective electrode of the one or more electrodes of the second set of electrodes. In some embodiments, the one or more wires comprise 4-12 wires. In some embodiments, the first set of electrodes comprises a plurality of wires disposed above the ion beam path, wherein the electric potential difference between a given wire of the plurality of wires and a closest nearby wire of the plurality of wires does not exceed 200 V. In some embodiments, the second set of electrodes comprises a plurality of wires disposed below the ion beam path, wherein the electric potential difference between a given wire of the plurality of wires and a closest nearby wire of the plurality of wires does not exceed 200 V.

In some embodiments, a method for electrostatic deflection of an ion beam is provided, wherein the method comprises: biasing a first set of electrodes disposed above an ion beam path, the first set of electrodes comprising a first entrance-end electrode positioned closest to an entrance aperture and a first exit-end electrode positioned closest to an exit aperture, such that electric potentials of the first entrance-end electrode and the first exit-end electrode differ by at most 5%; and biasing a second set of electrodes disposed below the ion beam path, the second set of electrodes comprising a second entrance-end electrode positioned closest to the entrance aperture and a second exit-end electrode positioned closest to the exit aperture, such that electric potentials of the second entrance-end electrode and the second exit-end electrode differ by at most 5%, wherein the first set of electrodes comprises a different number of electrodes than the second set of electrodes.

In some embodiments, biasing the first set of electrodes comprises biasing the first set of electrodes to electric potentials that are less negative than electric potentials to which the second set of electrodes are biased. In some embodiments: biasing the first set of electrodes comprises biasing a plurality of electrodes of the first set of electrodes such that electric potentials of the plurality of electrodes of the first set of electrodes differ by at least 5%; and biasing the second set of electrodes comprises biasing the second set of electrodes such that electric potentials of the second set of electrodes differ by at most 5%. In some embodiments, biasing the first set of electrodes comprises applying electric potentials between −2 kV and −15 kV to one or more electrodes of the first set of electrodes. In some embodiments, biasing the second set of electrodes comprises applying electric potentials between −5 kV and −15 kV to one or more electrodes of the second set of electrodes. In some embodiments, biasing the first set of electrodes produces an electric potential distribution across the first set of electrodes, from the first entrance-end electrode to the first exit-end electrode, that is symmetric. In some embodiments, biasing the second set of electrodes produces an electric potential distribution across the second set of electrodes, from the second entrance-end electrode to the second exit-end electrode, that is symmetric. In some embodiments, biasing the first set of electrodes, the second set of electrodes, or both, deflects a central ray trajectory of the ion beam at a vertical angle of between 30 degrees and 90 degrees. In some embodiments, biasing the first set of electrodes, the second set of electrodes, or both, deflects a central ray trajectory of the ion beam at a vertical angle of 35 degrees. In some embodiments, biasing the first set of electrodes, the second set of electrodes, or both, comprises producing at least one effect on the ion beam selected from a group consisting of: parallelizing the ion beam, focusing the ion beam, and increasing a divergence of the ion beam.

In some embodiments, any of the features of any of the embodiments described above and/or described elsewhere herein may be combined, in whole or in part, with one another. Additional advantages will be readily apparent to those skilled in the art from the following figures and detailed description. The aspects and descriptions herein are to be regarded as illustrative in nature and not restrictive.

BRIEF DESCRIPTION OF THE FIGURES

The patent or application file contains at least one drawing executed in color. Copies of this patent or patent application publication with color drawings(s) will be provided by the Office upon request and payment of the necessary fee.

A better understanding of the features and advantages of the present disclosure will be obtained by reference to the following detailed description that sets forth illustrative embodiments, in which the principles of the disclosure are utilized, and the accompanying figures of which:

FIG. 6 depicts a process for electrostatically deflecting an ion beam, according to some embodiments.

DETAILED DESCRIPTION

Figure 1A:
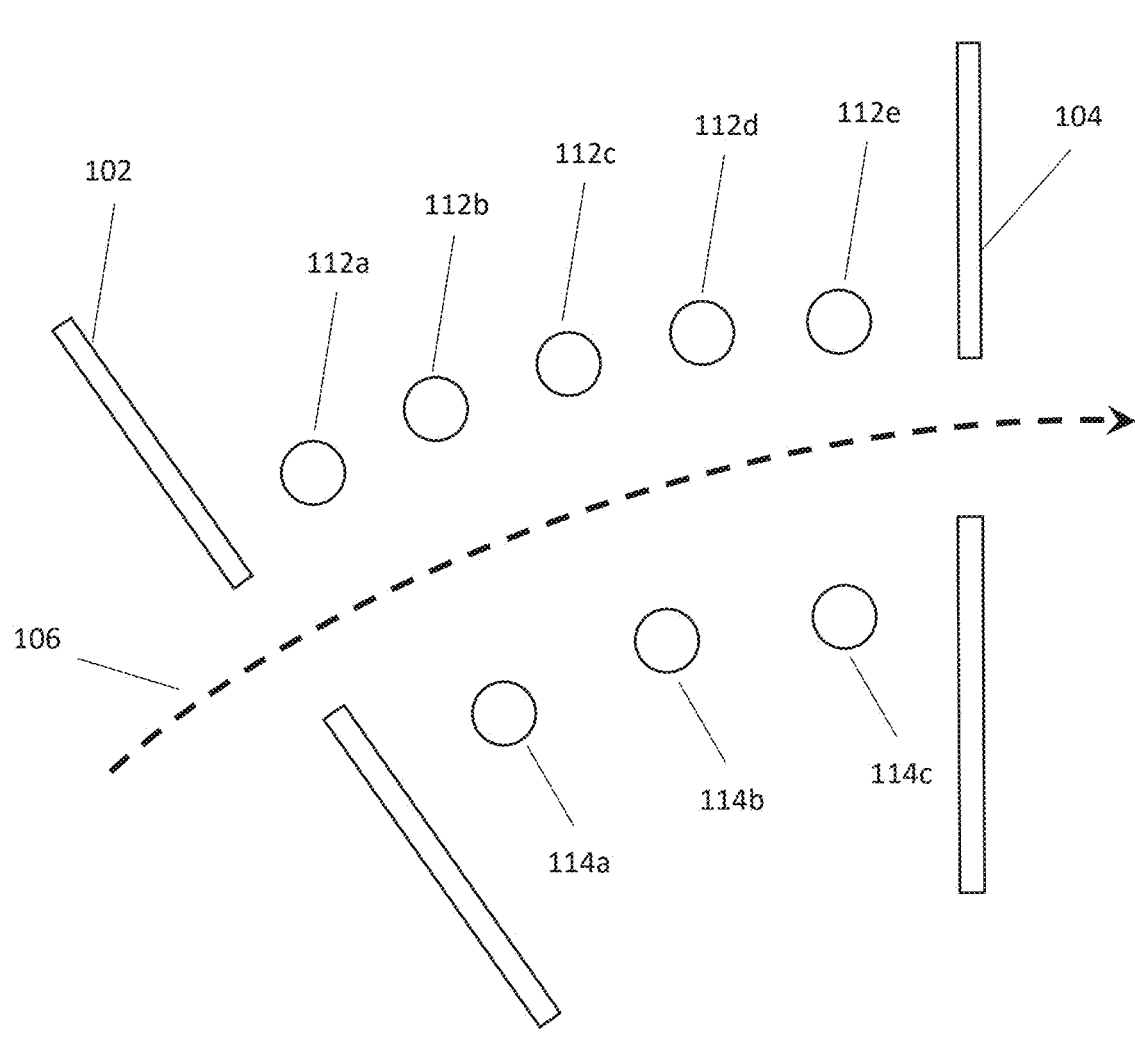
FIG. 1A depicts a cross-sectional view of an exemplary device for electrostatic deflection of an ion beam, according to some embodiments.

Disclosed herein are devices and methods for electrostatically deflecting and filtering wide ion beams by generating controlled electric field gradients between sets of electrodes positioned above and below an ion beam path. An exemplary electrostatic deflection device may include an entrance aperture through which ions enter a deflection region, an exit aperture through which ions of desired energy leave the device, and a plurality of upper and lower electrodes arranged orthogonally relative to the ion beam path with electric potentials that define ion trajectories. These upper and lower electrode sets may be asymmetric, each including different numbers of electrodes, for example five upper electrodes and three lower electrodes, optionally spaced substantially evenly along arcs of differing radii. Such an arrangement may allow an exemplary electrostatic deflection device to establish smooth and compact electric potential distributions while maintaining sufficient spacing for high-voltage operation and vacuum conductance.

In some implementations, one or more electrodes of the upper set of electrodes may be biased to mutually different electric potentials that are less negative than electric potentials to which electrodes of the lower set of electrodes are biased. Such a potential distribution may thereby generate electric field gradients that deflect a positively charged ion beam downward while applying substantially no net acceleration or deceleration between device entrance and exit. For example, entrance-end and exit-end electrodes of the upper set of electrodes may be biased to electric potentials that differ by at most approximately 5%, and entrance-end and exit-end electrodes of the lower set of electrodes may be biased to electric potentials that differ by at most approximately 5%, ensuring that the energy of ions entering an exemplary electrostatic deflection device is preserved upon exit. Within the deflection region, forces exerted by electric field gradients may steer the ion beam through a predetermined vertical angle, for example a vertical angle exceeding 30 degrees, and may further provide focusing, parallelization, and/or controlled divergence (e.g., defocusing or increasing divergence) of ion trajectories. Because the deflection imparted to an ion varies inversely with its incident energy, devices disclosed herein may function as energy filters that prevent ions outside a desired energy or charge-state window from exiting a given device and reaching the workpiece.

Thus, disclosed methods may enable control of beam deflection and filtering while differing from known systems that include symmetric electrode geometries and that apply a net acceleration or deceleration. In contrast, asymmetric upper-lower electrode arrangements and controlled electric potential distributions disclosed herein may accommodate high deflection angles in a compact footprint while preserving the beam's net energy and reducing the likelihood of electrical discharge.

Additionally, the disclosed devices may incorporate electrodes formed as solid rods, multi-component structures, and/or wire-based geometries. These geometries may reduce exposed surface area and particulate accumulation and/or improve vacuum conductance. Side plates of the disclosed devices may form single-piece insulating structures that maintain electrode alignment, while piston-type vacuum seals may enable high-voltage coupling directly to electrodes. Such configurations may support integration of an exemplary device into a larger ion-beam processing system and may enable low-energy ion delivery, for example at energies between 1 keV and 15 keV, with improved energy purity.

In the following description of the various embodiments, it is to be understood that the singular forms "a," "an," and "the" used in the following description are intended to include the plural forms as well, unless the context clearly indicates otherwise. It is also to be understood that the term "and/or" as used herein refers to and encompasses any and all possible combinations of one or more of the associated listed terms. It is further to be understood that the terms "includes," "including," "comprises," and/or "comprising," when used herein, specify the presence of stated features, integers, steps, operations, elements, components, and/or units but do not preclude the presence or addition of one or more other features, integers, steps, operations, elements, components, units, and/or groups thereof.

FIG. 1A depicts a cross-sectional view of an electrostatic deflection device 100 configured to deflect an ion beam at a predetermined vertical angle thereby providing energy-dependent filtration, without imparting a net change to the beam's energy. By arranging a set of electrodes orthogonal to the ion beam path, a desired electric field shape may be generated to independently deflect and focus the ion beam.

As shown, electrostatic deflection device 100 includes an entrance aperture 102 through which an ion beam may enter the deflection region (e.g., the region including electric field gradients), and an exit aperture 104 through which the ion beam may leave electrostatic deflection device 100 after undergoing predetermined angular deflection and energy-based filtration of ions outside a desired energy or charge-state window. For example, entrance aperture 102 and exit aperture 104 may define endpoints of an ion beam path 106 extending through the interior of electrostatic deflection device 100. In some implementations, ion beam path 106 may represent the central ray trajectory of an ion beam vertically deflected through electrostatic deflection device 100. The trajectories of individual ions however may not follow ion beam path 106 precisely. For example, individual ion trajectories through electrostatic deflection device 100 may be a function of the ion's position, trajectory, and/or energy at the entrance, and of the electric field gradients generated by the electric potential distribution of the upper and lower electrodes of electrostatic deflection device 100. In some implementations, electrostatic deflection device 100 may be incorporated within a larger ion processing or beamline system and may accommodate a wide ribbon ion beam or other beam geometries. For example, electrostatic deflection device 100 may form one of the final beamline elements of an ion implanter or other charged-particle processing system configured to deliver ions to semiconductor substrates such as 300 mm silicon wafers.

As shown in FIG. 1A, electrostatic deflection device 100 may include an upper set of cylindrical electrodes such as electrodes 112a, 112b, 112c, 112d, and/or 112e disposed above ion beam path 106 and extending orthogonal to ion beam path 106. These electrodes may extend along at least a portion of ion beam path 106 between entrance aperture 102 and exit aperture 104, and may be positioned to shape the electric fields encountered by ions traveling through the deflection region of electrostatic deflection device 100. As shown, the upper electrode set includes five electrodes, although in some implementations the upper electrode set may include at least two electrodes, at least three electrodes, at least four electrodes, at least five electrodes, at least six electrodes, at least seven electrodes, at least eight electrodes, at least nine electrodes, at most nine electrodes, at most eight electrodes, at most seven electrodes, at most six electrodes, at most five electrodes, at most four electrodes, at most three electrodes, or at most two electrodes. In some implementations, the upper electrode set may include three to seven electrodes. In some implementations, the number of upper electrodes may be based on the length of electrostatic deflection device 100 (e.g., axial length in the direction of ion beam propagation), desired deflection angle, and/or number of lower electrodes.

In some implementations, one or more of upper electrodes 112a, 112b, 112c, 112d, and/or 112e may be electrically isolated from one or more other electrodes of electrostatic deflection device 100. For example, upper electrodes 112a, 112b, 112c, 112d, and/or 112e may be biased independently or in groups to establish an electric potential distribution that influences the trajectory of ions entering electrostatic deflection device 100. In some implementations, one or more of upper electrodes 112a, 112b, 112c, 112d, and/or 112e may be biased to mutually different electric potentials to generate electric field gradients that support angular steering, parallelization, focusing, and/or controlled divergence of the ion beam. For example, the electric field gradients and resulting changes to ion trajectories may improve the uniformity of the ion beam's current distribution and/or angular distribution.

Electrostatic deflection device 100 may also include a lower set of cylindrical electrodes such as electrodes 114a, 114b, and/or 114c, disposed below ion beam path 106 and extending orthogonal to ion beam path 106. Similar to the upper electrode set, electrodes of the lower set may extend along at least a portion of ion beam path 106 between entrance aperture 102 and exit aperture 104, and may be positioned to shape the electric fields encountered by ions traveling through the deflection region of electrostatic deflection device 100. In some implementations, lower electrodes 114a, 114b, and/or 114c may be configured to establish a reference potential or to provide a substantially uniform potential distribution relative to the more varied potentials applied to the upper electrodes. The number of electrodes in the lower electrode set may be fewer than the number of electrodes in the upper set, thereby producing an asymmetric electrode distribution within electrostatic deflection device 100. As shown, the lower electrode set includes three electrodes, although in some implementations the lower electrode set may include at least one electrode, at least two electrodes, at least three electrodes, at least four electrodes, at least five electrodes, at least six electrodes, at least seven electrodes, at most seven electrodes, at most six electrodes, at most five electrodes, at most four electrodes, at most three, at most two electrodes, or at most one electrode. In some implementations, the lower electrode set may include one to five electrodes.

In some implementations, one or more of the upper and/or lower set of electrodes (e.g., electrodes 112a, 112b, 112c, 112d, 112e, 114a, 114b, and/or 114c) may be composed of one or more materials. For example, one or more of said electrodes may be composed of one or more of aluminum, stainless steel, graphite, carbon-based composites, titanium, molybdenum, tungsten, tantalum, and/or silicon carbide. In some implementations, one or more of said electrodes may be composed of graphite, while in other implementations, one or more of said electrodes may be composed of aluminum. In some implementations, one or more electrodes of the upper and/or lower set of electrodes may include an approximately rectangular cross-section. For example, in such implementations, said one or more electrodes may form a plate electrode. In some implementations, a plurality of the upper and/or lower set of electrodes may be joined together to form an approximately rectangular cross-section. For example, in such implementations, said plurality of electrodes may form a plate electrode.

Electrode spacing and positioning relative to ion beam path 106 may be selected to generate electric field gradients for a particular vertical deflection angle, while also account-ing for practical considerations such as the overall envelope of electrostatic deflection device 100 and electrical operating limits, including voltage standoff capability and susceptibil-ity to electrical discharge.

For example, the distance between a given electrode and ion beam path 106 may influence the electric potentials that are safely or effectively applied to that electrode. Electrodes positioned closer to ion beam path 106, and thus closer to electrodes on the opposite side of ion beam path 106, may operate at lower absolute electric potentials to generate a given electric field strength at ion beam path 106, however the likelihood of stray ions from the ion beam striking the electrode surface may increase. In contrast, electrodes posi-tioned further from ion beam path 106, and thus further from electrodes on the opposite side of ion beam path 106, may operate at higher absolute electric potentials to produce a comparable electric field strength at ion beam path 106. Increasing electric potentials may increase local electric field strength between adjacent electrodes, thereby increas-ing the risk of electrical discharge unless electrode-to-electrode spacing is correspondingly increased, thereby increasing the overall envelope of electrostatic deflection device 100.

For example, electrodes may be positioned along linear or curved lines, and spacing between electrodes may be uni-form or varied based on the electric field gradients associ-ated with the desired deflection angle. In some implemen-tations, the upper and/or lower electrodes may be positioned along an arc. For example, the upper electrodes may follow an arc having a larger radius than the arc followed by the lower electrodes. When similar electrode spacing is main-tained along each arc, the larger-radius arc may accommo-date a greater number of electrodes. This geometric rela-tionship may contribute to the above-described asymmetric upper-lower electrode distribution (e.g., the upper set of electrodes including a greater number of electrodes than the lower set of electrodes), and may enable a shorter ion beam path and a more compact overall geometry relative to a symmetric upper-lower electrode distribution. For example, an asymmetric electrode distribution may support a high deflection angle without significantly expanding the geo-metric envelope of a given electrostatic deflection device.

For example, an asymmetric upper-lower electrode dis-tribution may support vertical deflection angles (e.g., angles of deflection of the central ray trajectory of the ion beam) of at least 15 degrees, at least 20 degrees, at least 21 degrees, at least 25 degrees, at least 30 degrees, at least 35 degrees, at least 40 degrees, at least 45 degrees, at least 50 degrees, at least 60 degrees, at least 70 degrees, at least 80 degrees, or at least 90 degrees. For example, the electrode distribu-tion may support a deflection angle of between 30 degrees and 90 degrees. For example, the electrode distribution may support a deflection angle of 35 degrees. Larger vertical deflection angles may increase the angular separation between ions of different energies. This larger angular separation may in turn improve energy purity of the beam reaching the workpiece given that ions of energies outside of an acceptable range are less likely to pass through the exit aperture. Electrostatic deflection device 100 may bend beams at the aforementioned deflection angles that have a beam energy at entrance aperture 102 of at least 1 keV, at least 2 keV, at least 3 keV, at least 4 keV, at least 5 keV, at least 6 keV, at least 7 keV, at least 8 keV, at least 9 keV, at least 10 keV, at least 11 keV, at least 12 keV, at least 13 keV, at least 14 keV, at least 15 keV, at most 15 keV, at most 14 keV, at most 13 keV, at most 12 keV, at most 11 keV, at most 10 keV, at most 9 keV, at most 8 keV, at most 7 keV, at most 6 keV, at most 5 keV, at most 4 keV, at most 3 keV, at most 2 keV, or at most 1 keV. In some implementations, electro-static deflection device 100 may bend beams at the afore-mentioned deflection angles that have a beam energy at entrance aperture 102 of 5-15 keV. In other implementa-tions, electrostatic deflection device 100 may bend beams at the aforementioned deflection angles that have a beam energy at entrance aperture 102 of at most 5 keV. The beam energy at entrance aperture 102 may correspond to the beam energy at which ions were extracted from an ion source located upstream of electrostatic deflection device 100.

As described above, inter-electrode spacing may be uni-form or may vary based on deflection angle and desired electric field strength or distribution. For example, the edge-to-edge spacing between electrodes may be at least 10 mm, at least 15 mm, at least 20 mm, at least 25 mm, at least 30 mm, at least 35 mm, at least 40 mm, at most 40 mm, at most 35 mm, at most 30 mm, at most 25 mm, at most 20 mm, at most 15 mm, or at most 10 mm. For example, electrodes may be located along curved lines of similar arc length and may be spaced substantially evenly with an edge-to-edge spacing of approximately 15 mm to 30 mm. Such position-ing and spacing may be determined to generate electric field gradients described in greater detail below, while also allow-ing sufficient vacuum conductance through and around the upper and lower sets of electrodes.

Upper electrodes 112a, 112b, 112c, 112d, and/or 112e and lower electrodes 114a, 114b, and/or 114c may be positioned along ion beam path 106 and may be shaped to reduce exposed surface area while maintaining structural stability. In some implementations, one or more of the electrodes may include a circular cross section, forming a rod of a diameter that is at least 4 mm, at least 6 mm, at least 8 mm, at least 10 mm, at least 12 mm, at least 14 mm, at least 16 mm, at least 18 mm, at least 20 mm, at least 22 mm, at least 24 mm, at least 26 mm, at least 28 mm, at least 30 mm, at least 32 mm, at most 32 mm, at most 30 mm, at most 28 mm, at most 26 mm, at most 24 mm, at most 22 mm, at most 20 mm, at most 18 mm, at most 16 mm, at most 14 mm, at most 12 mm, at most 10 mm, at most 8 mm, at most 6 mm, or at most 4 mm. For example, one or more electrodes may include a circular cross section between 8 mm and 24 mm in diameter. For example, one or more electrodes may include a circular cross section 16 mm in diameter. Ion beam path 106 may be a function of the distribution of the upper and lower sets of electrodes and may be at least 100 mm, at least 150 mm, at least 200 mm, at least 250 mm, at least 300 mm, at most 300 mm, at most 250 mm, at most 200 mm, at most 150 mm, or at most 100 mm in length.

Figure 1B:
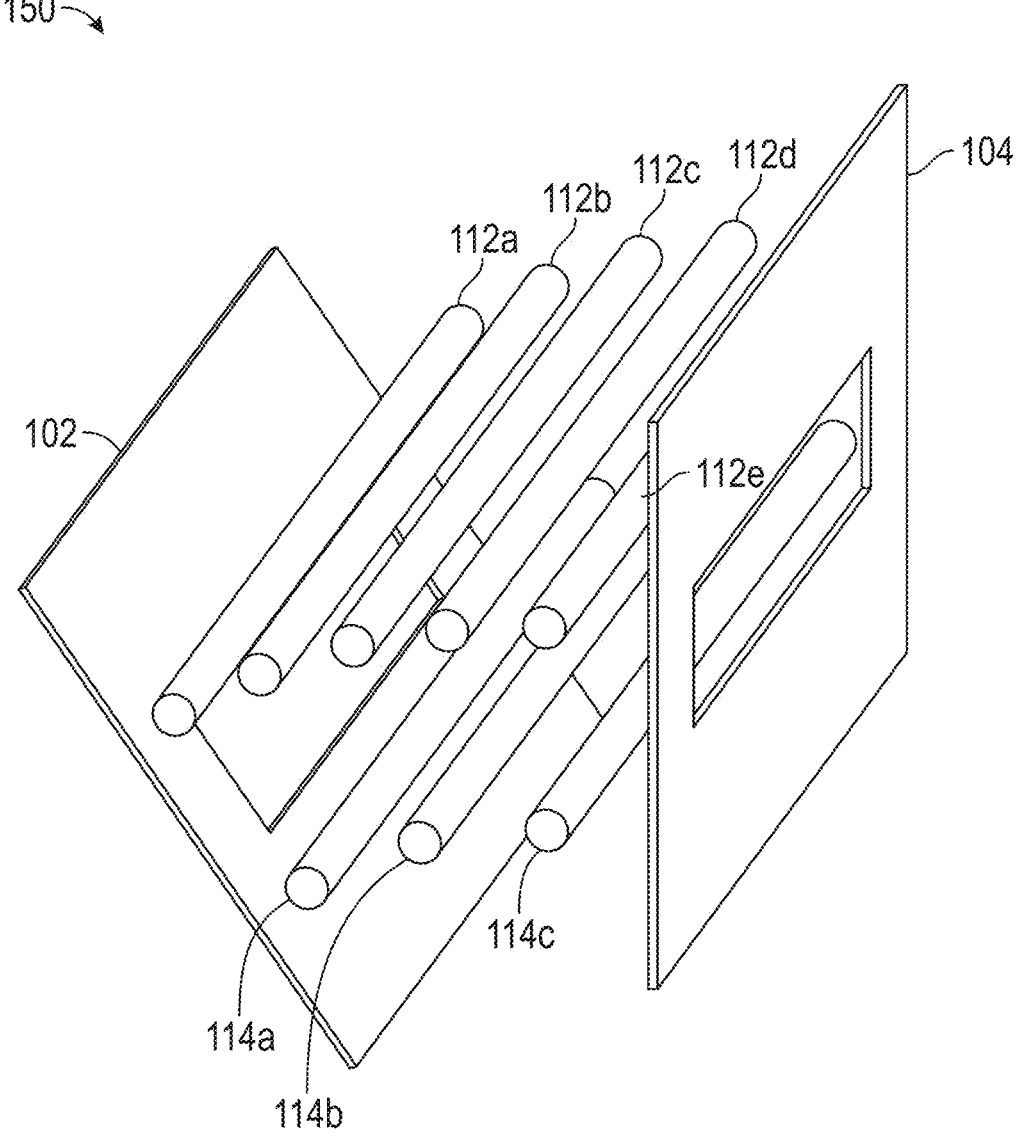
FIG. 1B depicts a perspective view of an exemplary device for electrostatic deflection of an ion beam, according to some embodiments.

FIG. 1B depicts a perspective view of electrostatic deflec-tion device 100, illustrating the spatial arrangement of entrance aperture 102, exit aperture 104, upper electrodes 112a, 112b, 112c, 112d, and 112e, and lower electrodes 114a, 114b, and 114c. Both FIGS. 1A and 1B depict an arrangement in which upper and lower sets of electrodes are spaced approximately evenly. Such an arrangement enables the generation of smooth electric field gradients while ensuring the electrodes are positioned close enough to control ion trajectories effectively without being so close as to accumulate significant deposition or experience signifi-cant ion impingement. By limiting the potentials on indi-vidual electrodes, such an arrangement enables a more compact overall device geometry.

As shown, entrance aperture 102 and exit aperture 104 may each form openings that are sized to admit the ion beam, (e.g., a ribbon-shaped ion beam). In some implementations, the width of entrance aperture 102 and/or exit aperture 104 (e.g., width orthogonal to the ion beam path) may be at least 150 mm, at least 200 mm, at least 250 mm, at least 300 mm, at least 350 mm, at least 400 mm, at least 450 mm, at least 500 mm, at least 550 mm, at least 600 mm, at most 600 mm, at most 550 mm, at most 500 mm, at most 450 mm, at most 400 mm, at most 350 mm, at most 300 mm, at most 250 mm, at most 200 mm, or at most 150 mm, depending on the ion beam width and downstream system constraints.

The height of entrance aperture 102 and/or exit aperture 104 may likewise be determined to ensure sufficient clearance for the ion beam. The exit aperture height in particular may be determined based on energy purity constraints. For example, as described above, the deflection of an ion is a function of the ion's incident energy and ions at different energies may therefore become vertically displaced as they pass through electrostatic deflection device 100. For example, particles entering electrostatic deflection device 100 may obtain a different energy than intended by undergoing a charge-state interaction (e.g., neutralization or further ionization) with residual gas, thereby reducing or increasing susceptibility to electric field gradients and gaining a greater or lesser amount of energy as a result. Which ion energies are transmitted by electrostatic deflection device 100 may thereby be determined at least in part by the exit aperture height. For example, a greater exit aperture height may allow ions with a wider spread of energies to be transmitted, whereas a lower exit aperture height may block ions whose trajectory deviates by a threshold amount from the intended trajectory, thereby improving the energy purity of the transmitted beam. In some implementations, the height of entrance aperture 102 and/or exit aperture 104 may be at least 10 mm, at least 20 mm, at least 30 mm, at least 40 mm, at least 50 mm, at least 60 mm, at least 70 mm, at least 80 mm, at least 90 mm, at least 100 mm, at least 110 mm, at least 120 mm, at most 120 mm, at most 110 mm, at most 100 mm, at most 90 mm, at most 80 mm, at most 70 mm, at most 60 mm, at most 50 mm, at most 40 mm, at most 30 mm, at most 20 mm, or at most 10 mm.

In some implementations, the length of one or more electrodes of electrostatic deflection device 100 may depend in part on, for example, ion beam width and/or desired electric field uniformity. For example, one or more electrodes may have a length (e.g., length orthogonal to the ion beam path) of at least 150 mm, at least 200 mm, at least 250 mm, at least 300 mm, at least 350 mm, at least 400 mm, at least 450 mm, at least 500 mm, at least 550 mm, at least 600 mm, at least 650 mm, at least 700 mm, at most 700 mm, at most 650 mm, at most 600 mm, at most 550 mm, at most 500 mm, at most 450 mm, at most 400 mm, at most 350 mm, at most 300 mm, at most 250 mm, at most 200 mm, or at most 150 mm. For example, in some implementations one or more electrodes may have a length of 600 mm.

Figure 2:
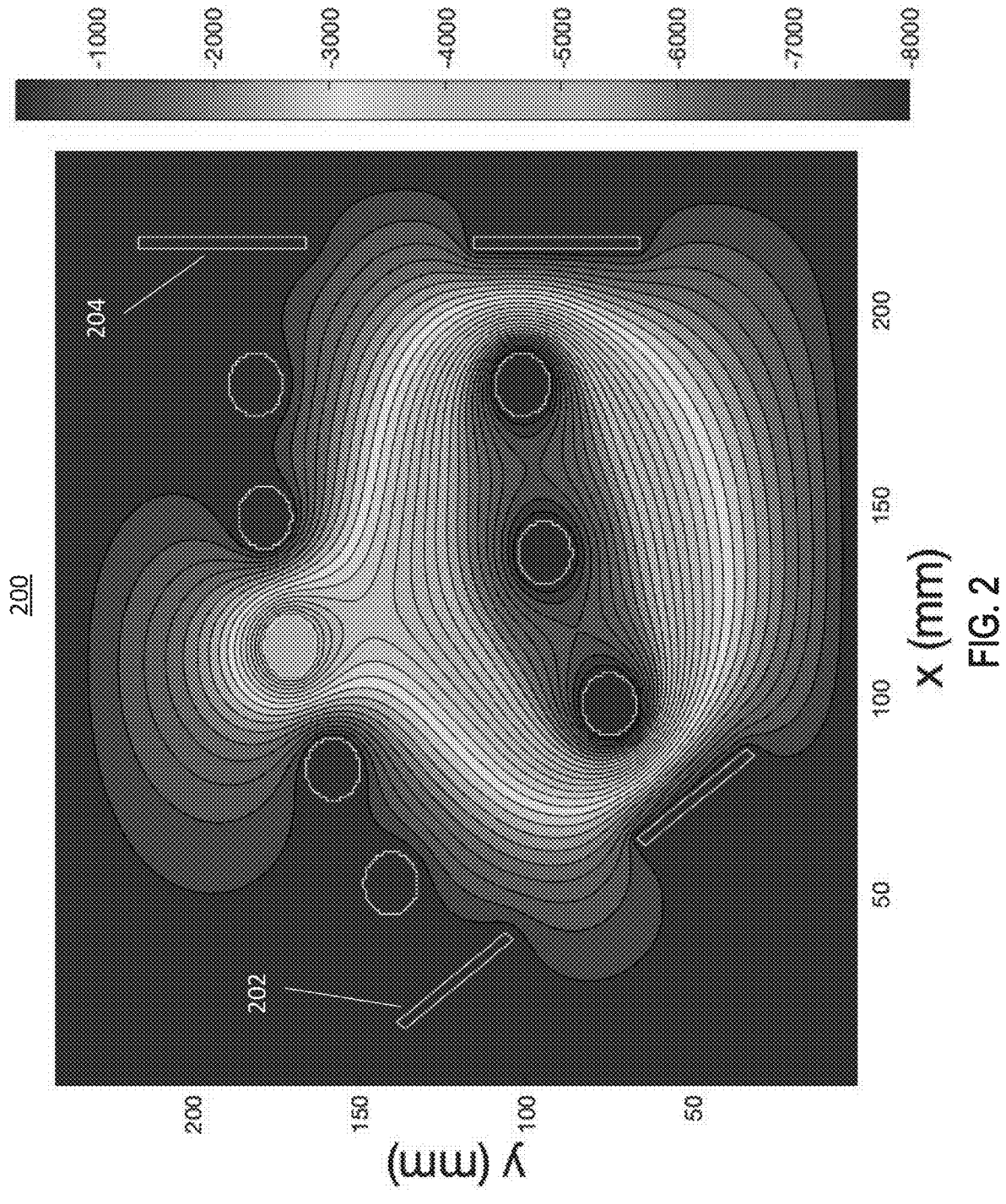
FIG. 2 depicts a contour map of electric potentials within an exemplary device for electrostatic deflection of an ion beam, according to some embodiments.

FIG. 2 depicts a contour map 200 of electric potentials generated by an exemplary biasing configuration of upper and lower sets of electrodes of an electrostatic deflection device. Contour map 200 includes lines of constant potential (e.g., equipotential lines) within the electrostatic deflection device.

Contour map 200 illustrates how electric potentials applied to individual electrodes may produce spatial patterns of potential and therefore electric field gradients that independently deflect and focus the ion beam (e.g., the ribbon ion beam) without imparting a net change in beam energy from device entrance to exit. In particular, contour map 200 reflects the fact that the entrance-end and exit-end electrodes in both the upper and lower sets of electrodes may be biased to electric potentials that are substantially the same. For example, the entrance-end and exit-end electrodes in the upper set of electrodes may be biased to electric potentials that differ by at most 1%, at most 2%, at most 3%, at most 4%, at most 5%, at most 6%, at most 7%, at most 8%, at most 9%, or at most 10%. For example, the entrance-end and exit-end electrodes in the lower set of electrodes may be biased to electric potentials that differ by at most 1%, at most 2%, at most 3%, at most 4%, at most 5%, at most 6%, at most 7%, at most 8%, at most 9%, or at most 10%. For example, the entrance-end and exit-end electrodes in the upper set of electrodes may be biased to electric potentials that differ by at most 5%. For example, the entrance-end and exit-end electrodes in the lower set of electrodes may be biased to electric potentials that differ by at most 5%. In this way, the electrostatic deflection device may maintain substantially equal beam energy at device entrance and exit without applying a net acceleration or deceleration to ions transiting the device.

One or more electrodes of the upper set of electrodes may be biased to electric potentials between approximately −1 kV and −15 kV. For example, one or more electrodes of the upper set of electrodes may be biased to electric potentials of at least −1 kV, at least −2 kV, at least −3 kV, at least −4 kV, at least −5 kV, at least −6 kV, at least −7 kV, at least −8 kV, at least −9 kV, at least −10 kV, at least −11 kV, at least −12 kV, at least −13 kV, at least −14 kV, at least −15 kV, at most −15 kV, at most −14 kV, at most −13 kV, at most −12 kV, at most −11 kV, at most −10 kV, at most −9 kV, at most −8 kV, at most −7 kV, at most −6 kV, at most −5 kV, at most −4 kV, at most −3 kV, at most −2 kV, or at most −1 kV. For example, one or more electrodes of the upper set of electrodes may be biased to electric potentials between approximately −2 kV and −15 kV.

Similarly, one or more electrodes of the lower set of electrodes may be biased to electric potentials between approximately −1 kV and −15 kV. For example, one or more electrodes of the lower set of electrodes may be biased to electric potentials of at least −1 kV, at least −2 kV, at least −3 kV, at least −4 kV, at least −5 kV, at least −6 kV, at least −7 kV, at least −8 kV, at least −9 kV, at least −10 kV, at least −11 kV, at least −12 kV, at least −13 kV, at least −14 kV, at least −15 kV, at most −15 kV, at most −14 kV, at most −13 kV, at most −12 kV, at most −11 kV, at most −10 kV, at most −9 kV, at most −8 kV, at most −7 kV, at most −6 kV, at most −5 kV, at most −4 kV, at most −3 kV, at most −2 kV, or at most −1 kV. For example, one or more electrodes of the lower set of electrodes may be biased to electric potentials between approximately −2 kV and −15 kV. For example, one or more electrodes of the lower set of electrodes may be biased to electric potentials between approximately −5 kV and −15 kV.

In other implementations, one or more electrodes of the upper set of electrodes may be biased to electric potentials between approximately +1 kV and +15 kV. For example, one or more electrodes of the upper set of electrodes may be biased to electric potentials of at least +1 kV, at least +2 kV, at least +3 kV, at least +4 kV, at least +5 kV, at least +6 kV, at least +7 kV, at least +8 kV, at least +9 kV, at least +10 kV, at least +11 kV, at least +12 kV, at least +13 kV, at least +14 kV, at least +15 kV, at most +15 kV, at most +14 kV, at most +13 kV, at most +12 kV, at most +11 kV, at most +10 kV, at most +9 kV, at most +8 kV, at most +7 kV, at most +6 kV, at most +5 kV, at most +4 kV, at most +3 kV, at most +2 kV, or at most +1 kV. For example, one or more electrodes of the upper set of electrodes may be biased to electric potentials between approximately +2 kV and +15 kV.

Similarly, one or more electrodes of the lower set of electrodes may be biased to electric potentials between approximately +1 kV and +15 kV. For example, one or more electrodes of the lower set of electrodes may be biased to electric potentials of at least +1 kV, at least +2 kV, at least +3 kV, at least +4 kV, at least +5 kV, at least +6 kV, at least +7 kV, at least +8 kV, at least +9 kV, at least +10 kV, at least +11 kV, at least +12 kV, at least +13 kV, at least +14 kV, at least +15 kV, at most +15 kV, at most +14 kV, at most +13 kV, at most +12 kV, at most +11 kV, at most +10 kV, at most +9 kV, at most +8 kV, at most +7 kV, at most +6 kV, at most +5 kV, at most +4 kV, at most +3 kV, at most +2 kV, or at most +1 kV. For example, one or more electrodes of the lower set of electrodes may be biased to electric potentials between approximately +2 kV and +15 kV. For example, one or more electrodes of the lower set of electrodes may be biased to electric potentials between approximately +5 kV and +15 kV.

For example, as shown in contour map 200 of FIG. 2A, the upper electrode closest to the entrance aperture 202 (e.g., the upper entrance-end electrode), the second upper electrode from entrance aperture 202, the fourth upper electrode from entrance aperture 202, and the upper electrode closest to the exit aperture 204 (e.g., the upper exit-end electrode) may be at ground potential, while the third upper electrode from entrance aperture 202 may be biased to a negative electric potential, for example −5 kV. Further, the lower electrode closest to the entrance aperture 202 (e.g., the lower entrance-end electrode), the second lower electrode from entrance aperture 202, and the lower electrode closest to the exit aperture 204 (e.g., the lower exit-end electrode) may be biased to a negative electric potential, for example −8 kV as shown. In this way, contour map 200 illustrates a configuration in which the electrodes are biased such that electric potentials of a plurality of electrodes of the upper set of electrodes differ by at least 1%, at least 2%, at least 3%, at least 4%, at least 5%, at least 6%, at least 7%, at least 8%, at least 9%, or at least 10%. For example, contour map 200 illustrates a configuration in which the electrodes are biased such that electric potentials of a plurality of electrodes of the upper set of electrodes differ by at least 5%. Contour map 200 further illustrates a configuration in which the electrodes are biased such that electric potentials of one or more electrodes of the lower set of electrodes differ by at most 1%, at most 2%, at most 3%, at most 4%, at most 5%, at most 6%, at most 7%, at most 8%, at most 9%, or at most 10%. For example, contour map 200 illustrates a configuration in which the electrodes are biased such that electric potentials of one or more electrodes of the lower set of electrodes differ by at most 5%.

Contour map 200 further illustrates a configuration in which the upper electrodes are set to potentials that are less negative relative to electric potentials the lower electrodes are set to, thereby generating electric field gradients that bend the ion beam (e.g., an ion beam composed of positive ions) downward at a predetermined angle while maintaining the approximately same net ion energy from entrance to exit. For example, to maintain the approximately same net ion energy, the electric potential configuration illustrated by contour map 200 includes approximately symmetric potential distributions across the upper and lower sets of electrodes. Namely, contour map 200 depicts a configuration in which the outer two electrodes of the upper set of electrodes are at the same potential and all electrodes of the lower set of electrodes at the same potential, as described above.

In other implementations, the upper electrodes may be biased according to a symmetric potential distribution such as, from the upper entrance-end electrode to the upper exit-end electrode, −2 kV, −5 kV, −6 kV, −5 kV, and −2 kV, while the lower electrodes may similarly be biased according to a symmetric potential distribution such as, from the lower entrance-end electrode to the lower exit-end electrode, −6 kV, −9 kV, and −6 kV. To enable the above-described potential distributions, a plurality of upper and/or lower electrodes may be electrically coupled to one another via the same power supply. For example, pairs of electrodes may be electrically coupled to one another via the same power supply. For example, the upper entrance-end electrode and upper exit-end electrode may be electrically coupled to one another via the same power supply, the second upper electrode from entrance aperture 202 and the fourth upper electrode from entrance aperture 202 may be electrically coupled to one another via the same power supply, and the lower entrance-end electrode and lower exit-end electrode may be electrically coupled to one another via the same power supply. In this way, the number of power supplies may be fewer than the number of electrodes when symmetric or grouped potential distributions are employed.

The electric field gradients such as those corresponding to contour map 200, in addition to enabling angular deflection of the ion beam, may support beam focusing, defocusing, and parallelization, depending on the distribution of electric potentials across the upper and lower sets of electrodes. For example, contour lines that curve inward toward the ion beam path may produce electric field gradients that converge ion trajectories and thereby provide a focusing effect. In some implementations, increasing the difference between electric potentials of adjacent electrodes may generate localized field curvature that produces such a focusing effect. For example, electrode potentials may be configured such that ions are deflected to produce a beam divergence including vertical angles of between 0 degrees and +10 degrees relative to the central ray trajectory of the ion beam. In other implementations, electrode potentials may be configured such that ions are deflected to produce a beam divergence including vertical angles of between 0 degrees and +15 degrees relative to the central ray trajectory.

Additionally, one or more of the electrodes may be set to negative electric potentials relative to ground, as shown in contour map 200. Operating one or more of the electrodes at negative potentials may suppress stray electron generation because electrons are not accelerated toward the electrodes, thereby reducing the number of high-energy electrons that would otherwise produce X-ray emissions. In some implementations, one or more of the electrodes may be set to positive electric potentials relative to ground, thereby increasing the potential difference to other electrodes and enabling stronger electric field gradients that improve deflection and/or provide additional control over focusing and/or divergence of the ion beam.

Figure 3:
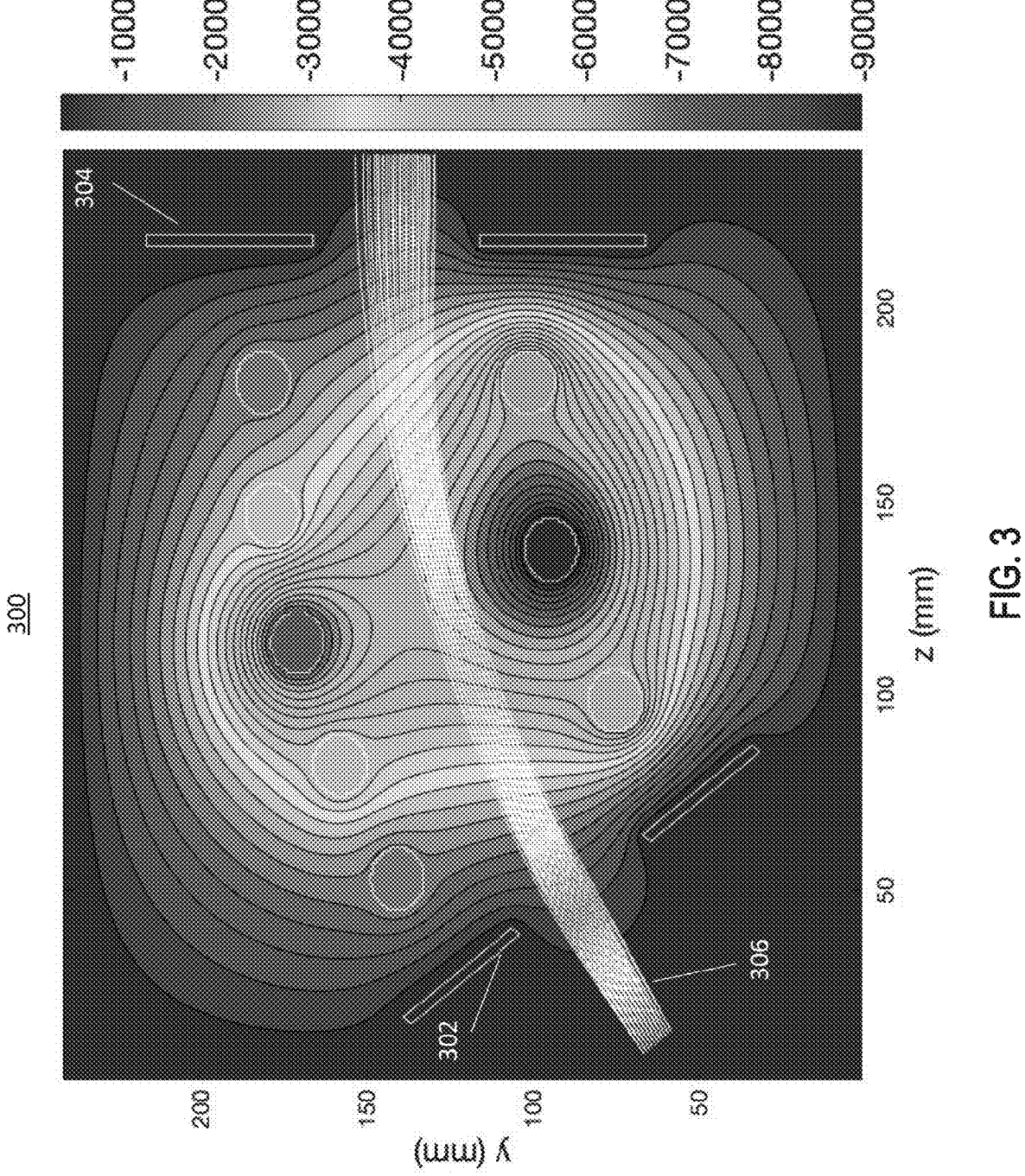
FIG. 3 depicts ion beam trajectories and a contour map of electric potentials within an exemplary device for electrostatic deflection of an ion beam, according to some embodiments.

FIG. 3 depicts a contour map 300 of electric potentials generated by an exemplary biasing configuration of upper and lower sets of electrodes of an electrostatic deflection device, along with representative ion trajectories 306. Representative ion trajectories 306 are depicted as lines running substantially from the lower left to the upper center right of contour map 300.

Similar to contour map 200, contour map 300 reflects the fact that the entrance-end and exit-end electrodes in both the upper and lower sets of electrodes may reach electric potentials that are substantially the same, thereby preserving ion energy and performing limited net acceleration or deceleration. For example, as shown in contour map 300, the upper electrode closest to the entrance aperture 302 (e.g., the upper entrance-end electrode) may be biased to −2 kV, the second upper electrode from entrance aperture 302 may be biased to −4 kV, the third upper electrode from entrance aperture 302 may be biased to −7 kV, the fourth upper electrode from entrance aperture 302 may be biased to −3 kV, and the upper electrode closest to the exit aperture 304 (e.g., the upper exit-end electrode) may be biased to −2 kV. Further, the lower electrode closest to the entrance aperture 302 (e.g., the lower entrance-end electrode) and the lower electrode closest to the exit aperture 304 (e.g., the lower exit-end electrode) may be biased to −6 kV while the second lower electrode from entrance aperture 302 may be biased to −9 kV as shown.

Ion trajectories 306 are governed by the electric field gradients illustrated in contour map 300 which steer the ion beam such that its central ray trajectory bends at a predetermined vertical angle and passes through the exit aperture as shown in FIG. 3. As described above, the resulting deflection angle varies with incident ion energy such that ions within the desired energy range are parallel to or approximately parallel to the intended central ray trajectory, while ions outside of this energy range deviate from this trajectory and may be blocked by the exit aperture from reaching the workpiece.

In some implementations, the electric potential configuration of the upper and/or lower sets of electrodes may instead impart a net acceleration or deceleration to ions transiting the electrostatic deflection device. For example, if the lower and/or upper exit-end electrodes are biased to a more negative electric potential than corresponding entrance-end electrodes, the resulting potential gradient along the ion beam path may accelerate ions (e.g., positive ions) such that their energy at the exit exceeds their energy at the entrance. Conversely, if the lower and/or upper exit-end electrodes are biased to a more positive electric potential than the entrance-end electrodes, the resulting potential gradient along the ion beam path may decelerate ions (e.g., positive ions) such that their energy at the entrance exceeds their energy at the exit. Such acceleration or deceleration modes may thereby tune the energy of ions delivered to a workpiece. This tuning may compensate for upstream beamline components that adjust ion beam energy, ensure beam energy matches a specific energy levels for implantation or charged-particle applications, and/or may enable parallelization, focusing, and/or controlled divergence of the beam to a greater degree relative to modes that impose no net acceleration or deceleration.

In some implementations, one or more electrodes of an exemplary electrostatic deflection device may be biased to a positive or negative electric potential relative to upstream and/or downstream beamline components, and/or relative to ground potential. For example, the electrostatic deflection device and/or the beamline elements upstream of it may be held at a negative potential with respect to ground, thus decelerating or slowing down the beam (e.g., a beam of positive ions) as it exits the electrostatic deflection device (e.g., as it experiences a positive potential gradient). For example, the electrostatic deflection device and/or the beamline elements upstream of it may be held at a positive potential with respect to ground, thus accelerating or speeding up the beam (e.g., a beam of positive ions) as it exits the electrostatic deflection device (e.g., as it experiences a negative potential gradient). For example, the electrostatic deflection device may be floated several kilovolts below ground potential to accelerate ions (e.g., positive ions) entering and passing through the device or, conversely, raised several kilovolts above ground potential to decelerate ions (e.g., positive ions) entering and passing through the device. Such biasing configurations may simplify integration with beamlines operating at elevated or reduced electric potentials, lower electric field gradients at the entry and/or exit of the electrostatic deflection device, and/or provide an additional tuning parameter for controlling properties of the ion beam and/or beam energy delivered to downstream components or to the workpiece.

The motion of ions through the deflection region may be described using the Lorentz force, which relates the force on a charged particle to the electric field it experiences. In the absence of significant magnetic fields, an ion's change in velocity is determined by its charge and the electric field integrated along its path. When the entrance and exit potentials are substantially equal, the ion's speed remains constant and only its direction changes in response to the electric potential gradients generated by the electrode sets. Under these conditions, the resulting deflection angle depends on the ion's charge, energy, and the integrated electric field, such that ions of different masses but equal energy experience the same angular deflection.

For example, Forces on non-relativistic charged particles can be described mathematically by the Lorentz force:

$$\vec{F} = m\frac{d\vec{v}}{dt} = q\left(\vec{E} + \vec{v}\times\vec{B}\right)$$

Where: F is a vector of force, m is the mass of the charged particle, v is the vector velocity of the charged particle, q is the charge on the particle, E is the electric field the particle experiences, and B is the magnetic field the particle experiences.

If the magnetic field in the region of interest is zero or small enough to be negligible, this equation reduces to:

$$m\frac{d\vec{v}}{dt} = q\vec{E}.$$

Or describing the change in the particle's velocity:

$$\frac{d\vec{v}}{dt} = \frac{q}{m}\vec{E}.$$

To examine a particle traveling through a region with an electric field within it, it makes more sense to look at this equation as the integral along the path the particle follows. For this, rewriting the above equation in the form of an integral yields:

$$\int_{t_0}^{t_f} d\vec{v} = \int_{t_0}^{t_f} \frac{q}{m}\vec{E}dt$$

The left hand side of the above equation may be integrated, and the integration constant may be added and chosen to be the particle's initial velocity. Further, $\Delta\vec{v}=(\vec{v}_f-\vec{v}_i)$ yields:

$$\int_{t_0}^{t_f} d\vec{v} = \vec{v}(t_f) - \vec{v}(t_i) = \left(\vec{v}_f - \vec{v}_i\right)$$

$$\Rightarrow \Delta \vec{v} = \int_{t_0}^{t_f} \frac{q}{m} \vec{E} dt$$

The above can be represented by three equations, in $\hat{x}$, $\hat{y}$, and $\hat{z}$ directions. Said integrals are over time, and as stated above, it may be desirable to consider the effect on the particle over its path through the region of electric field. Note that $\vec{x} = \vec{x}(t) = \vec{x} \ x(t) + \vec{y} \ y(t) + \vec{z} \ z(t)$ is the position vector of the ion as a function of time, yielding:

$$\vec{v}_f - \vec{v}_i = \Delta \vec{v} = \int_{t_0}^{t_f} \frac{q}{m} \vec{E} \frac{dx}{dx} dt$$

Given that the potential of the entering ions and the exiting ions are the same, the energy of the ions will be the same, and thus the initial and the final velocities will be equal in magnitude, while different in direction. For angles of deflection that are reasonably large (<~45 degrees) note that $$\tan \theta \approx \theta \Rightarrow \approx \arctan\frac{o}{A}.$$

Dividing both sides by $|v_i|$ yields:

$$\theta \approx \frac{\Delta \vec{v}}{|v_i|} = \frac{1}{|v_i|} \int_{x_0}^{x_f} \frac{q}{m} \vec{E} \frac{dx}{dx} d\vec{x}$$

Note that the velocity through the region of interest is relatively constant, yielding:

$$\theta \approx \frac{2q}{mv^2} \int_{x_0}^{x_f} \vec{E} d\vec{x} = \frac{q}{W_i} \int_{x_0}^{x_f} \vec{E} d\vec{x}$$

Where: $W_i$ is the energy of the ion. Note here, the deflection (the change in the ion velocity) does not depend on the mass of the ion, only the charge of the ion, the energy of the ion and the electric field along the path the ion travels.

Figure 4A:
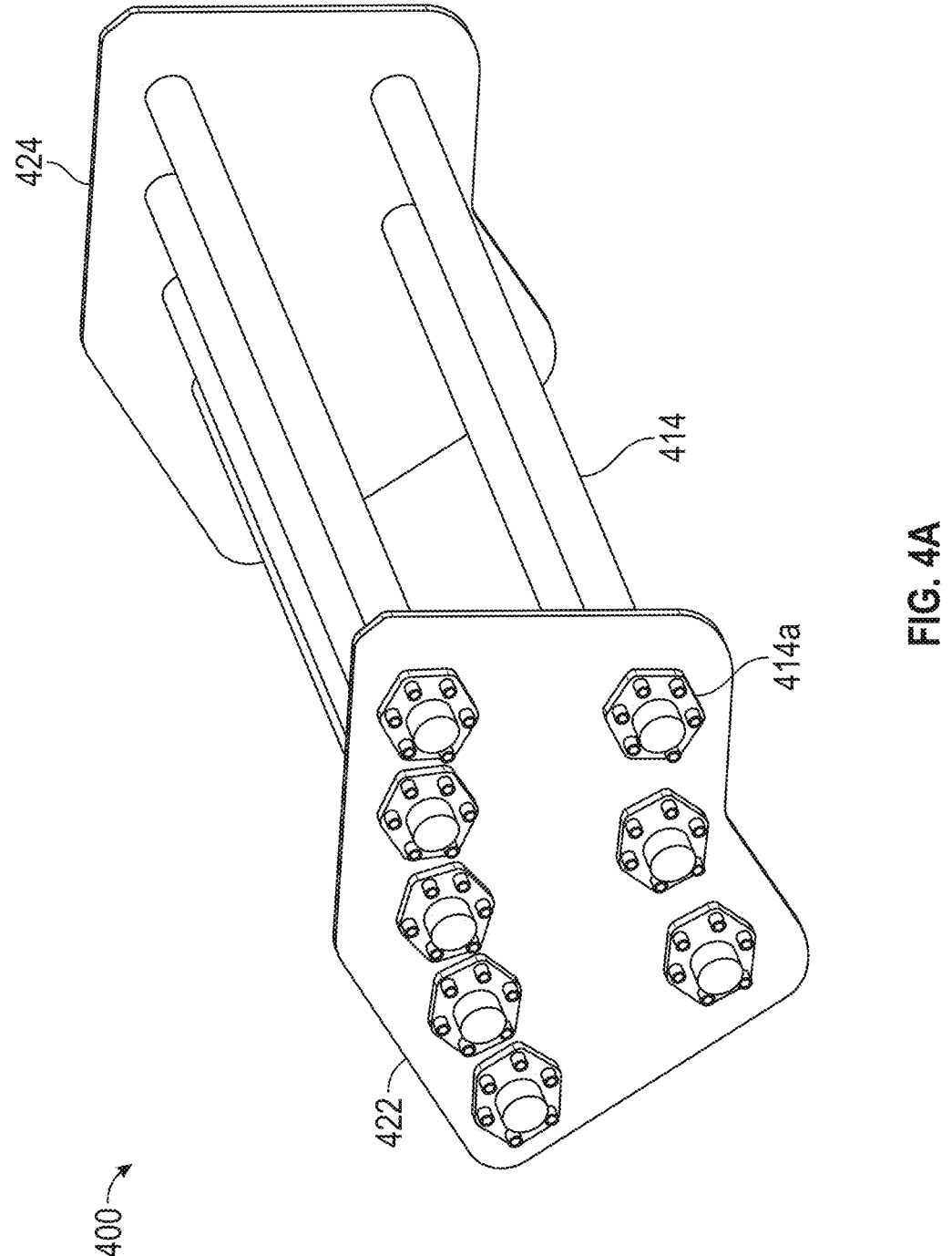
FIG. 4A depicts a perspective view of exemplary insulating supports of a device for electrostatic deflection of an ion beam, according to some embodiments.

FIG. 4A depicts a perspective view of electrostatic deflection device 400 including side plates 422 and 424 and electrode-mounting structures configured to hold the upper and lower electrodes in fixed spatial relationship. Side plates 422 and/or 424 may function as single-piece insulating bodies that electrically isolate one or more upper and/or lower electrodes from one another. For example, side plates 422 and/or 424 may function as single-piece insulating bodies that electrically isolate each electrode (e.g., both upper and lower electrodes) from all other electrodes. In some implementations, side plates 422 and/or 424 may be formed from a dimensionally stable, high-dielectric material such as PEEK, Ultem, or a similar machinable polymer capable of withstanding high electric-field gradients, maintaining structural rigidity, and/or operating reliably under high-vacuum conditions without significant outgassing or charge buildup. In some implementations, side plates 422 and/or 424 may be formed from a ceramic material such as alumina, aluminum nitride, zirconia, silicon nitride, or a glass-ceramic material.

As shown in FIG. 4A, individual electrodes such as electrode 414 may be secured to corresponding electrode mounting plates such as electrode mounting plate 414a. These electrode mounting plates may attach to side plates 422 and 424 using a set of fasteners and may include alignment features that maintain intended electrode position and orientation relative to nearby electrodes. For example, side plates 422 and/or 424 may incorporate precision-machined recesses or positioning surfaces that establish consistent electrode-to-electrode tolerances throughout electrostatic deflection device 400. In some implementations, electrode mounting plates and/or electrodes themselves may include electrical interfaces allowing selected electrodes or electrode groups to be biased independently or in combination to generate predetermined electric potential distributions. In some implementations, such electrical interfaces may include vacuum feedthroughs and/or electrical connection features integrated into the electrode mounting plates and/or electrodes themselves, thereby enabling delivery of high-voltage signals while maintaining electrical isolation.

Figure 4B:
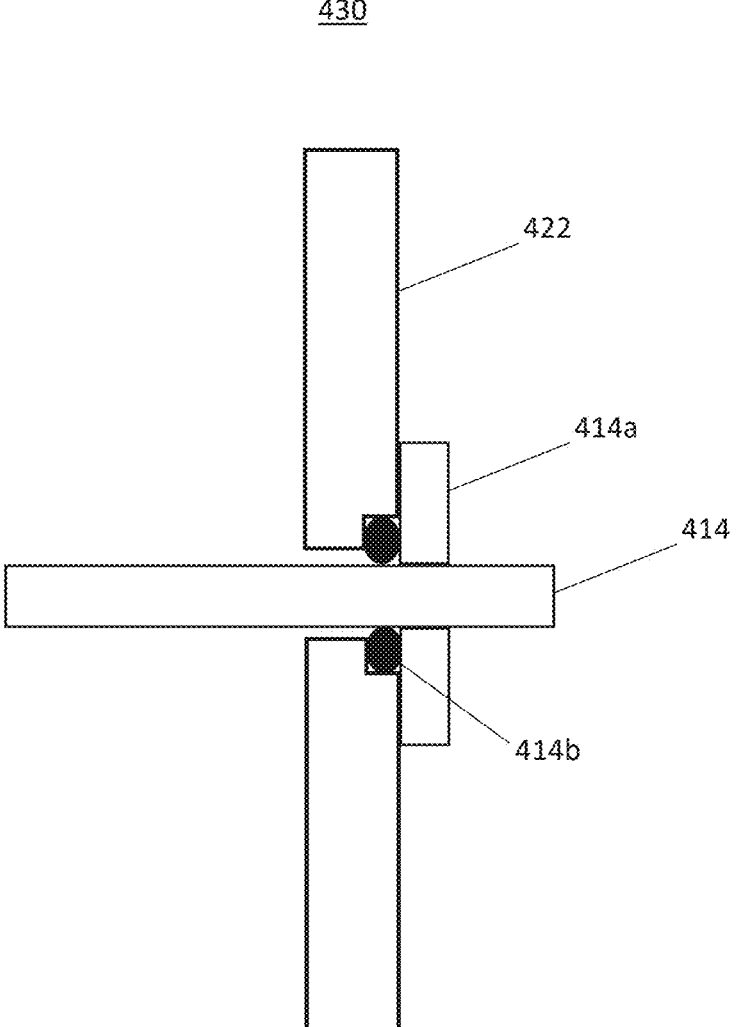
FIG. 4B depicts a cross-sectional view of an exemplary piston-type vacuum seal of a device for electrostatic deflection of an ion beam, according to some embodiments.

Side plates 422 and/or 424, optionally in combination with electrode mounting plates, may further include piston-type vacuum seals for introducing each electrode into the vacuum environment of electrostatic deflection device 400. Such piston-type vacuum seals may include an annular sealing interface that engages an electrode or an electrode support structure, thereby forming a hermetic seal while allowing the electrode to be installed, removed, and/or repositioned. For example, as depicted by the piston-type vacuum seal 430 in FIG. 4B, said annular sealing interface may take the form of a cylindrical recess in side plate 422 lined with an O-ring or elastomeric seal 414b that compressively engages the outer surface of inserted electrode 414 to form a vacuum-tight piston interface. In some implementations, attaching corresponding electrode mounting plate 414a to side plate 422 may compress O-ring or elastomeric seal 414b thereby enhancing compression of the electrode and stability of the seal. Piston-type vacuum seals similar to piston-type vacuum seal 430 may be utilized to seal other electrode interfaces at side plate 422 and/or side plate 424, for example. Piston-type vacuum seals may reduce the number of components involved in creating a vacuum seal, simplify maintenance, and/or maintain tighter alignment tolerances by sealing directly at side plate 422 and/or 424 rather than relying on multiple intermediate components.

Figure 4C:
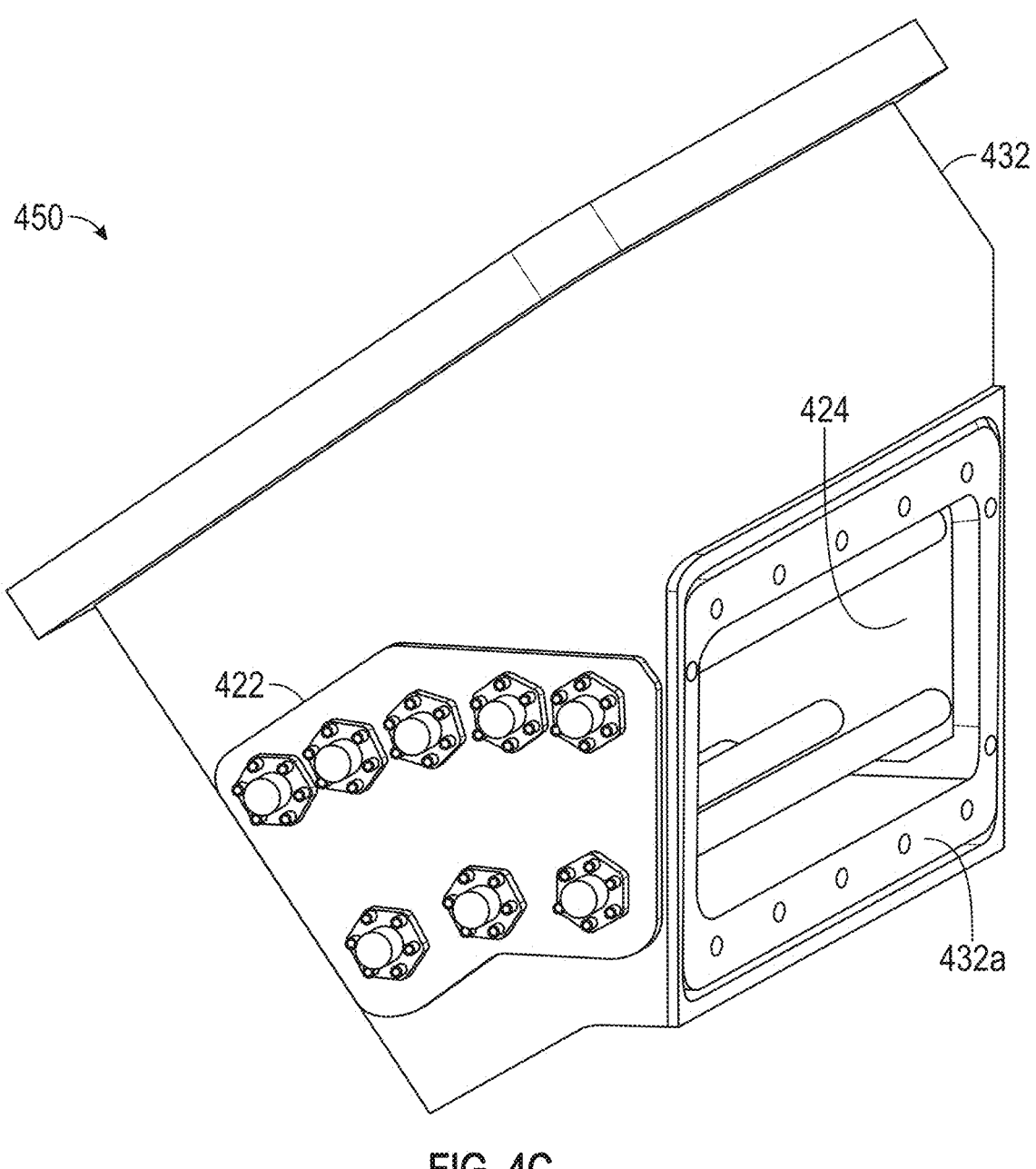
FIG. 4C depicts a perspective view of an exemplary vacuum chamber of a device for electrostatic deflection of an ion beam, according to some embodiments.

FIG. 4C depicts a perspective view of assembly 450 including vacuum chamber 432 and an electrostatic deflection device mounted and sealed to vacuum chamber 432 via side plates 422 and/or 424. For example, a vacuum seal may be created between vacuum chamber 432 and side plates 422 and/or 424 via an elastomeric seal such as an O-ring face seal. Vacuum chamber 432 may enclose the electrode region of the electrostatic deflection device and enable provision of a vacuum environment for stable ion-beam transport. In some implementations, vacuum chamber 432 may include one or more vacuum pump ports positioned to maintain low-pressure conditions within the electrode region, thereby supporting efficient evacuation of residual gases and improving beam stability. For example, vacuum chamber 432 may include one or more vacuum pump ports (e.g., two vacuum pump ports) configured to accommodate one or more turbo-molecular pumps (e.g., two turbo-molecular pumps) for maintaining high-vacuum conditions. Vacuum chamber 432 may further include a mounting face 432*a* configured to mount an exit aperture and/or downstream beamline components, allowing the electrostatic deflection device to be integrated into a larger beamline architecture.

The open geometry within the electrode region of the electrostatic deflection device, corresponding to use of rod electrodes, may improve vacuum conductance across the electrostatic deflection device, allowing gas molecules to be efficiently removed. This reduced obstruction to pumping may help maintain high-quality vacuum conditions, limit ion neutralization or charge-state alterations that may otherwise occur through gas interactions (thereby reducing energy contamination as described above), and reduce particulate deposition on electrode surfaces by minimizing stagnant regions in the vacuum flow.

Vacuum chamber 432 may additionally provide inherent shielding against X-ray emissions that may arise from electron interactions within the electrostatic deflection device. Because the walls of vacuum chamber 432 may be composed of metal such as aluminum, they may absorb or block X-rays generated at low levels within the electrode region. In some implementations, the mounting interface between vacuum chamber 432 and side plates 422 and/or 424 may include alignment features to define the position of electrodes relative to the entrance and/or exit apertures and to the ion beam itself, while enabling removal and replacement of the electrostatic deflection device.

An exemplary electrostatic deflection device may be configured with external dimensions enabling integration into larger ion processing systems. For example, electrostatic deflection device width (e.g., width orthogonal to the ion beam path) may be at least 400 mm, at least 450 mm, at least 500 mm, at least 520 mm, at least 550 mm, at least 600 mm, at least 650 mm, at least 700 mm, at most 700 mm, at most 650 mm, at most 600 mm, at most 550 mm, at most 520 mm, at most 500 mm, at most 450 mm, or at most 400 mm. Electrostatic deflection device width may be based on ion beam properties and/or electrode length, for example. For example, an electrostatic deflection device width of 520 mm may be used to accommodate electrodes of 600 mm in length. Electrostatic deflection device height may similarly accommodate the height of the upper and lower electrode sets, for example.

Figure 5A:
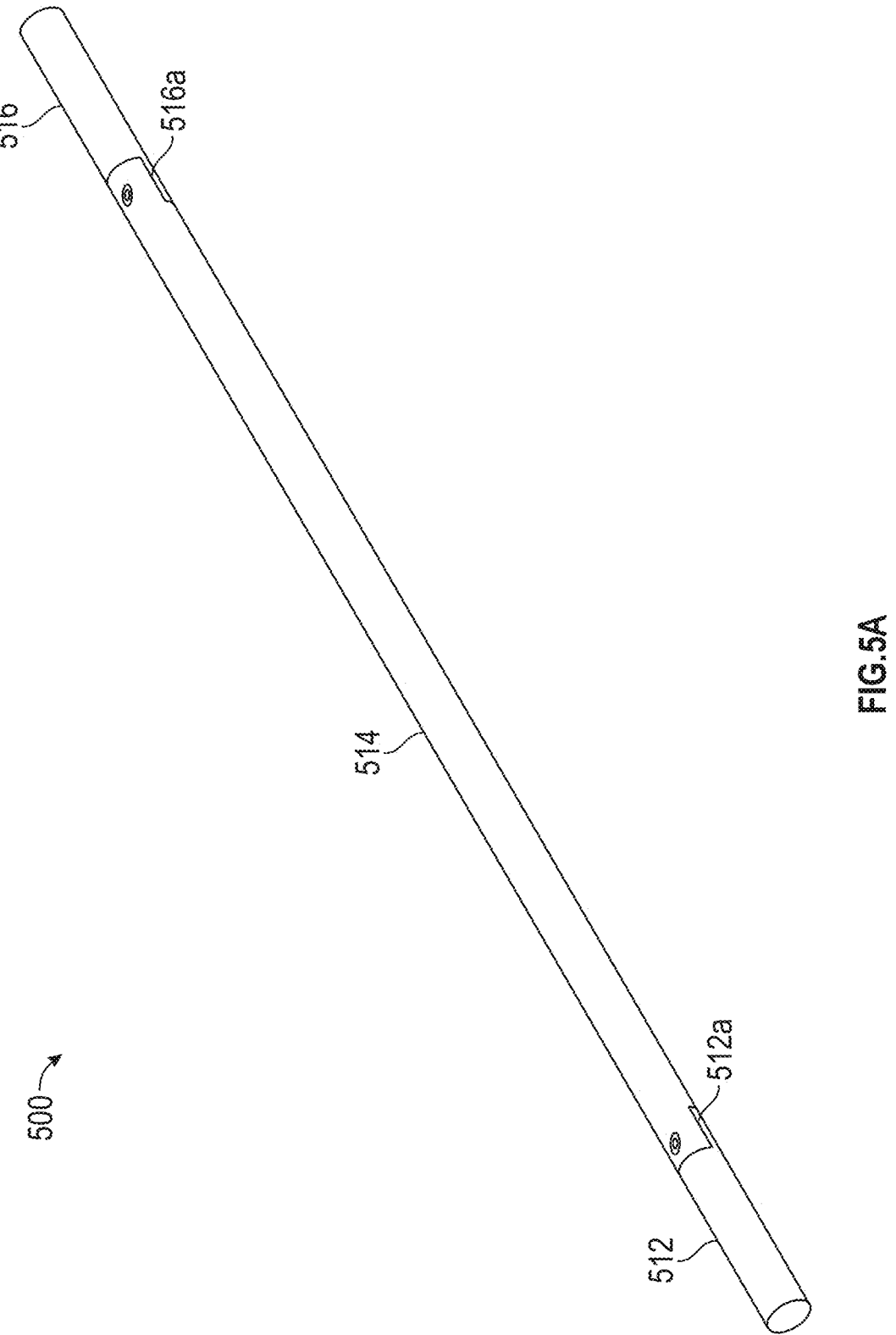
FIG. 5A depicts a perspective view of an exemplary multi-component electrode of a device for electrostatic deflection of an ion beam, according to some embodiments.

FIG. 5A depicts a perspective view of a multi-component electrode 500 including cylindrical edge portions 512 and 516 and a cylindrical center portion 514 positioned between them. As shown, cylindrical edge portions 512 and 516 may interface with each end of cylindrical center portion 514 at corresponding interfaces 512*a* and 516*a*. In some implementations, interfaces 512*a* and/or 516*a* may form flat surfaces that serve as mechanical alignment features. Interfaces 512*a* and/or 516*a* may additionally or alternatively permit the joining (e.g., mating) of the respective cylindrical edge portion to cylindrical center portion 514 in a rigid configuration, for example using one or more fasteners, while maintaining cylindricity and positioning of the electrode within an electrostatic deflection device.

In some implementations, one or more portions of multi-component electrode 500 (e.g., cylindrical edge portions 512 and 516 and cylindrical center portion 514) may be composed of one or more materials. For example, one or more of said portions may be composed of one or more of aluminum, stainless steel, graphite, carbon-based composites, titanium, molybdenum, tungsten, tantalum, and/or silicon carbide. In some implementations, one or more of said portions may be composed of graphite, while in other implementations, one or more of said portions may be composed of aluminum. In some implementations, multi-component electrode 500 may reduce material wear and/or particle contamination. For example, cylindrical edge portions 512 and/or 516 may include metal materials such as aluminum, stainless steel, or other conductive materials that enable electrical connection, mechanical mounting, and/or sealing through piston-type vacuum interfaces as described above. For example, cylindrical center portion 514 may include graphite, a carbon-based composite, or another low-contamination material that limits particle generation, especially generation of metal contaminants, reduces charge accumulation, and/or remains chemically stable under vacuum conditions. The multi-component arrangement of electrode 500 may additionally or alternatively enable replacement of one portion of electrode 500 without disturbing other portions, thereby simplifying maintenance and/or extending component lifespan.

Figure 5B:
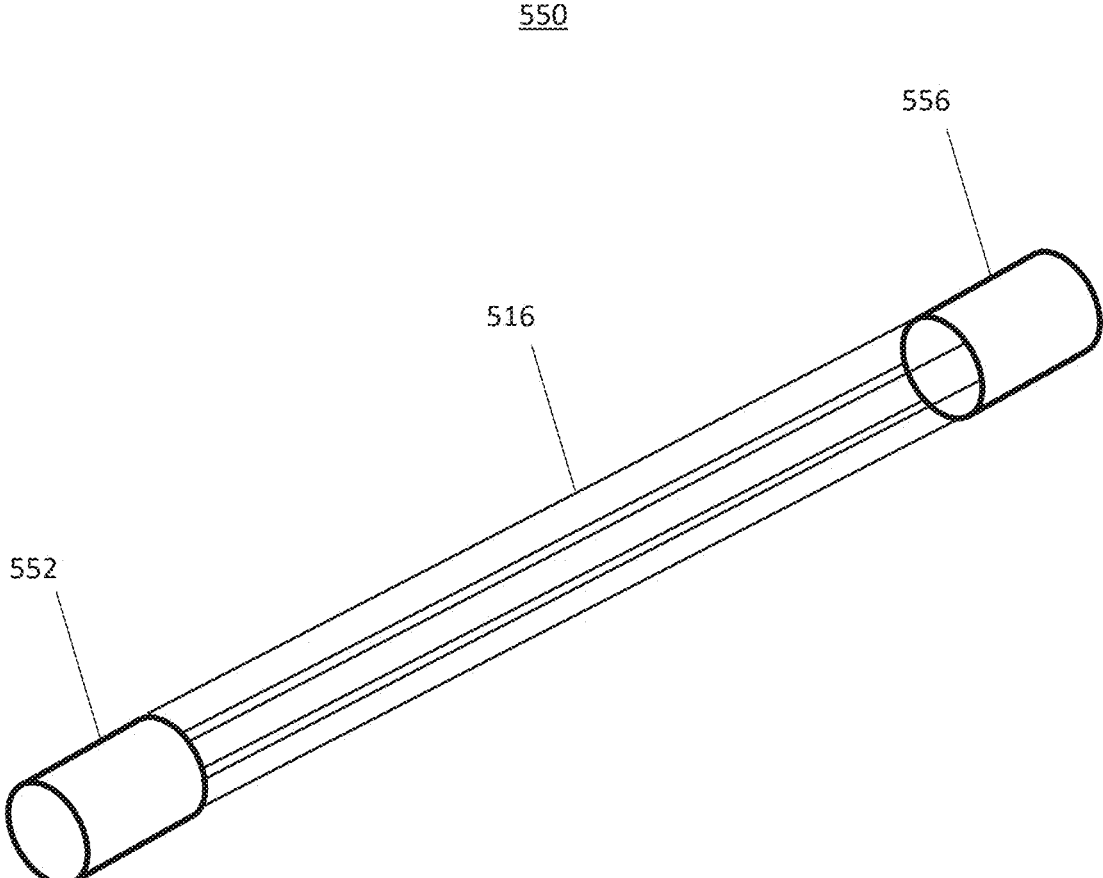
FIG. 5B depicts a perspective view of an exemplary wire-based electrode of a device for electrostatic deflection of an ion beam, according to some embodiments.

In some implementations, one or more lower and/or upper electrodes of an exemplary electrostatic deflection device may be formed from one or more conductive wires arranged circumferentially around a central axis. For example, such a wire-based electrode may include at least 1 wire, at least 2 wires, at least 3 wires, at least 4 wires, at least 6 wires, at least 8 wires, at least 10 wires, at least 12 wires, at least 14 wires, at least 16 wires, at most 16 wires, at most 14 wires, at most 12 wires, at most 10 wires, at most 8 wires, at most 6 wires, at most 4 wires, at most 3 wires, at most 2 wires, or at most 1 wire. For example, such a wire-based electrode may include 4-12 wires. For example, as depicted by wire-based electrode 550 in FIG. 5B, one or more wires such as wire 516 may be arranged to approximate a cylindrical outer boundary. Said one or more wires may be connected to and/or tensioned by end caps 552 and/or 556. In some implementations, each of the one or more wires may be biased to substantially the same electric potential. In some implementations, a single continuous wire may be wound back and forth between endcaps 552 and/or 556 to form the multiple circumferential segments arranged around a central axis as depicted in FIG. 5B.

In some implementations, instead of wires approximating cylindrical electrodes, the upper and/or lower set of electrodes may instead take the form of a series of wires (e.g., a plurality of wires) arranged along the ion beam path (e.g., one or more of the rod electrodes may take the form of a wire electrode). For example, wires of said series of wires may be individually biased to potentials that differ by at most approximately 50-200 V relative to adjacent wires (e.g., to one or more closest nearby wires). For example, wires of said series of wires may be individually biased to potentials that differ by at least 50 V, at least 100 V, at least 150 V, at least 200 V, at most 200 V, at most 150 V, at most 100 V, or at most 50 V relative to adjacent wires (e.g., to one or more closest nearby wires). In this way, the series of wires may define a potential gradient along the ion beam path in the same manner that the set of upper electrodes and the set of lower electrodes define a potential gradient. Such wire-based electrodes may reduce exposed electrode surface area, improving vacuum conductance, reducing particulate deposition, and/or lowering the risk of charge-state altering or neutralizing interactions.

In some implementations, one or more wires of the above-described wire-based electrode embodiments may be composed of one or more materials. For example, one or more of said wires may be composed of one or more of aluminum, stainless steel, carbon-based composites, titanium, molybdenum, tungsten, and/or tantalum. In some implementations, one or more of said wires may be composed of tungsten, while in other implementations, one or more of said wires may be composed of molybdenum.

FIG. 6 depicts a process 600 for operating an electrostatic deflection device to steer an ion beam through a predetermined vertical angle while maintaining controlled electric potential distributions across two sets of electrodes. At step 610, a first set (e.g., an upper set) of electrodes disposed above the ion beam path may be biased such that the upper entrance-end electrode and the upper exit-end electrode differ in electric potential by at most 5%. Such an electric potential distribution may ensure no substantial acceleration or deceleration is applied to the ion beam, thereby preserving the energy of the incident ion beam. In some implementations, the electric potentials applied during step 610 may form a substantially symmetric potential distribution across the upper set of electrodes, extending from the upper entrance-end electrode to the upper exit-end electrode. For example, as described above, the electric potential at the upper entrance-end electrode may be substantially the same as the electric potential at the upper exit-end electrode. This symmetric distribution may allow certain electrodes (e.g., electrodes with similar electric potential specifications) to be connected to and biased by the same power supply.

At optional sub-step 612, the upper set of electrodes may be biased to electric potentials that are less negative than electric potentials to which a lower set of electrodes are biased, thereby establishing an electric field suitable for downward deflection of a positively charged ion beam. At optional sub-step 614, a plurality of electrodes of the upper set of electrodes may be biased such that their electric potentials differ from one another by at least 5%. Said electric potential configurations may thereby produce localized variations in electric field gradients for focusing, parallelizing, and/or enabling controlled divergence of the ion beam. At optional sub-step 616, one or more electrodes of the upper set of electrodes may be biased to electric potentials between approximately −2 kV and −15 kV, for example. Said potentials may generate the desired electric field strength while maintaining reliable high-voltage operation of the electrostatic deflection device.

At step 620, a second set (e.g., a lower set) of electrodes disposed below the ion beam path may be biased such that the lower entrance-end electrode and the lower exit-end electrode differ in electric potential by at most 5%. Such an electric potential distribution may ensure no substantial acceleration or deceleration is applied to the ion beam, thereby preserving the energy of the incident ion beam. Because the upper set of electrodes may include a different number of electrodes than the lower set of electrodes, the electrostatic deflection device may include an asymmetric electrode distribution. In some implementations, the electric potentials applied during step 620 may form a substantially symmetric potential distribution across the lower set of electrodes, extending from the lower entrance-end electrode to the lower exit-end electrode. For example, as described above, the electric potential at the lower entrance-end electrode may be substantially the same as the electric potential at the lower exit-end electrode. This symmetric distribution may allow certain electrodes (e.g., electrodes with similar electric potential specifications) to be connected to and biased by the same power supply.

At optional sub-step 622, the lower set of electrodes may be biased such that their electric potentials differ by at most 5%. Said electric potential distribution may provide a substantially uniform reference potential against which the potentials applied to the upper set of electrodes may generate controlled electric field gradients for beam deflection, for example. At optional sub-step 624, one or more electrodes of the lower set of electrodes may be biased to electric potentials between approximately −5 kV and −15 kV, for example. Said potentials may allow electric field gradients generated between the upper and lower sets of electrodes to be tuned for the desired deflection angle, and/or to focus, parallelize, and/or enable controlled divergence of the ion beam.

Electric potential distributions established at steps 610 and/or 620 may alone or in combination deflect the central ray trajectory of the ion beam at a vertical angle between approximately 30 degrees and 90 degrees, depending for example on electrode spacing, potential magnitude, and/or incident beam energy. In some implementations, the applied electric potentials may deflect the central ray trajectory by approximately 35 degrees.

EXEMPLARY EMBODIMENTS

Exemplary embodiments of the device for electrostatic deflection of an ion beam described herein include:

Embodiment 1. A device for electrostatic deflection of an ion beam, wherein the device comprises:

a first set of electrodes disposed above an ion beam; and
a second set of electrodes disposed below an ion beam,
  wherein the first set of electrodes comprises a different number of electrodes than the second set of electrodes,
  wherein a plurality of the first set of electrodes is biased to mutually different electric potentials that are less negative than electric potentials to which a plurality of the second set of electrodes is biased, and
  wherein the plurality of the second set of electrodes is biased to substantially the same electric potential.

Embodiment 2. The device of embodiment 1, wherein the first set of electrodes comprises a greater number of electrodes than the second set of electrodes.

Embodiment 3. The device of embodiment 1 or 2, wherein biasing the plurality of the first set of electrodes and the plurality of the second set of electrodes generates electric fields across the ion beam such that a deflection angle of the ion beam varies inversely with an incident energy of ions of the ion beam.

Embodiment 4. The device of any one of embodiments 1-3, wherein the plurality of the first set of electrodes is biased to electric potentials between −2 kV and −10 kV.

Embodiment 5. The device of any one of embodiments 1-4, wherein the plurality of the second set of electrodes is biased to electric potentials between −5 kV and −10 kV.

Embodiment 6. The device of any one of embodiments 1-5, wherein biasing the plurality of the first set of electrodes and the plurality of the second set of electrodes generates electric fields that produce at least one effect on the ion beam selected from a group consisting of: parallelizing the ion beam, focusing the ion beam, and increasing the divergence of the ion beam.

Embodiment 7. The device of any one of embodiments 1-6, wherein the ion beam has a maximum energy of 10 keV.

Embodiment 8. The device of any one of embodiments 1-7, wherein the ion beam has a maximum energy of 15 keV.

Embodiment 9. The device of any one of embodiments 1-8, wherein ions of the ion beam comprise molecular ions.

Embodiment 10. The device of any one of embodiments 1-9, wherein a central ray trajectory of the ion beam is deflected at a vertical angle of greater than 30 degrees.

Embodiment 11. The device of any one of embodiments 1-10, wherein ions of the ion beam are deflected to produce vertical angles of between 0 degrees and 10 degrees relative to a central ray trajectory of the ion beam.

Embodiment 12. The device of any one of embodiments 1-11, wherein ions of the ion beam are deflected to produce vertical angles of between 0 degrees and 15 degrees relative to a central ray trajectory of the ion beam.

Embodiment 13. The device of any one of embodiments 1-12, wherein at least one of the first set of electrodes and the second set of electrodes comprise a piston vacuum seal for one or more electrodes, wherein the one or more electrodes comprise high-voltage structures mounted through the piston vacuum seal.

Embodiment 14. The device of embodiment 13, wherein the at least one of the first set of electrodes and the second set of electrodes comprise aluminum.

Embodiment 15. The device of any one of embodiments 1-14, wherein at least one of the first set of electrodes and the second set of electrodes comprise at least one geometry selected from a group consisting of: a rod, a plate, and one or more wires.

The foregoing description, for the purpose of explanation, has been described with reference to specific embodiments and/or examples. However, the illustrative discussions above are not intended to be exhaustive or to limit the invention to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

The invention claimed is:

1. A device for electrostatic deflection of an ion beam, wherein the device comprises:
   an entrance aperture to allow the ion beam to enter the device;
   an exit aperture to allow the ion beam to exit the device;
   a first set of electrodes disposed above an ion beam path, wherein the first set of electrodes comprises:
      a first entrance-end electrode positioned closest, of the first set of electrodes, to the entrance aperture; and
      a first exit-end electrode positioned closest, of the first set of electrodes, to the exit aperture, wherein the first entrance-end electrode is biased to within 5% of an electric potential to which the first exit-end electrode is biased; and
   a second set of electrodes disposed below the ion beam path, wherein the second set of electrodes comprises:
      a second entrance-end electrode positioned closest, of the second set of electrodes, to the entrance aperture; and
      a second exit-end electrode positioned closest, of the second set of electrodes, to the exit aperture, wherein the second entrance-end electrode is biased to within 5% of an electric potential to which the second exit-end electrode is biased, and
   wherein the first set of electrodes comprises a different number of electrodes than the second set of electrodes.

2. The device of claim 1, wherein the first set of electrodes are biased to electric potentials that are less negative than electric potentials to which the second set of electrodes are biased.

3. The device of claim 1, wherein:
   a plurality of electrodes of the first set of electrodes are biased such that electric potentials of the plurality of electrodes of the first set of electrodes differ by at least 5%, and
   the second set of electrodes are biased such that electric potentials of the second set of electrodes differ by at most 5%.

4. The device of claim 1, wherein one or more electrodes of the first set of electrodes and the second set of electrodes are biased to electric potentials between −2 kV and −15 kV.

5. The device of claim 1, wherein the first entrance-end electrode is electrically coupled to the first exit-end electrode, and the second entrance-end electrode is electrically coupled to the second exit-end electrode.

6. The device of claim 1, wherein the electric potential distribution across the first set of electrodes, from the first entrance-end electrode to the first exit-end electrode, is symmetric.

7. The device of claim 1, wherein the electric potential distribution across the second set of electrodes, from the second entrance-end electrode to the second exit-end electrode, is symmetric.

8. The device of claim 1, wherein the first set of electrodes comprises a greater number of electrodes than the second set of electrodes.

9. The device of claim 1, wherein the first set of electrodes comprises 3-7 electrodes and the second set of electrodes comprises 1-5 electrodes.

10. The device of claim 1, wherein the first set of electrodes comprises 5 electrodes and the second set of electrodes comprises 3 electrodes.

11. The device of claim 1, wherein the ion beam has a maximum energy of 5 keV.

12. The device of claim 1, wherein a central ray trajectory of the ion beam is deflected at a vertical angle of between 30 degrees and 90 degrees.

13. The device of claim 1, wherein a central ray trajectory of the ion beam is deflected at a vertical angle of 35 degrees.

14. The device of claim 1, wherein biasing the first set of electrodes and the second set of electrodes produces at least one effect on the ion beam selected from a group consisting of: parallelizing the ion beam, focusing the ion beam, and increasing a divergence of the ion beam.

15. The device of claim 1, wherein the device further comprises an insulator configured to electrically isolate an electrode of the first set of electrodes and an electrode of the second set of electrodes.

16. The device of claim 1, wherein one or more electrodes of the first set of electrodes, one or more electrodes of the second set of electrodes, or both, each comprise a circular cross section, wherein a diameter of the circular cross section is between 8 mm and 24 mm.

17. The device of claim 1, wherein the device further comprises one or more piston vacuum seals configured to hermetically seal one or more electrodes of the first set of electrodes, one or more electrodes of the second set of electrodes, or both.

18. The device of claim 1, wherein one or more electrodes of the first set of electrodes, one or more electrodes of the second set of electrodes, or both, comprise graphite and aluminum.

19. The device of claim 1, wherein one or more electrodes of the first set of electrodes, one or more electrodes of the second set of electrodes, or both, comprise a cylindrical graphite component, wherein the cylindrical graphite component is mated at a first end to a first cylindrical aluminum component and the cylindrical graphite component is mated at a second end to a second cylindrical aluminum component.

20. The device of claim 1, wherein one or more electrodes of the first set of electrodes or the second set of electrodes each comprise one or more wires disposed circumferentially about a central axis of a respective electrode of the one or more electrodes of the first set of electrodes or the second set of electrodes.

21. The device of claim 20, wherein the one or more wires comprise 4-12 wires.

22. The device of claim 1, wherein the first set of electrodes comprises a plurality of wires disposed above the ion beam path, wherein the electric potential difference between a given wire of the plurality of wires and a closest nearby wire of the plurality of wires does not exceed 200 V.

23. The device of claim 1, wherein the second set of electrodes comprises a plurality of wires disposed below the ion beam path, wherein the electric potential difference between a given wire of the plurality of wires and a closest nearby wire of the plurality of wires does not exceed 200 V.

24. A method for electrostatic deflection of an ion beam, wherein the method comprises:

biasing a first set of electrodes disposed above an ion beam path, the first set of electrodes comprising a first entrance-end electrode positioned closest to an entrance aperture and a first exit-end electrode positioned closest to an exit aperture, such that electric potentials of the first entrance-end electrode and the first exit-end electrode differ by at most 5%; and biasing a second set of electrodes disposed below the ion beam path, the second set of electrodes comprising a second entrance-end electrode positioned closest to the entrance aperture and a second exit-end electrode positioned closest to the exit aperture, such that electric potentials of the second entrance-end electrode and the second exit-end electrode differ by at most 5%, wherein the first set of electrodes comprises a different number of electrodes than the second set of electrodes.

25. The method of claim 24, wherein:

biasing the first set of electrodes comprises biasing a plurality of electrodes of the first set of electrodes such that electric potentials of the plurality of electrodes of the first set of electrodes differ by at least 5%; and biasing the second set of electrodes comprises biasing the second set of electrodes such that electric potentials of the second set of electrodes differ by at most 5%.

26. The method of claim 24, wherein biasing the first set of electrodes produces an electric potential distribution across the first set of electrodes, from the first entrance-end electrode to the first exit-end electrode, that is symmetric.

27. The method of claim 24, wherein biasing the second set of electrodes produces an electric potential distribution across the second set of electrodes, from the second entrance-end electrode to the second exit-end electrode, that is symmetric.

*    *    *    *    *